United States Patent

Odanaka et al.

[11] Patent Number: 6,121,655
[45] Date of Patent: Sep. 19, 2000

[54] NONVOLATILE SEMICONDUCTOR MEMORY DEVICE AND METHOD FOR FABRICATING THE SAME AND SEMICONDUCTOR INTEGRATED CIRCUIT

[75] Inventors: Shinji Odanaka; Kaori Akamatsu; Junichi Kato; Atsushi Hori, all of Osaka, Japan; Seiki Ogura, Wappingers Falls, N.Y.

[73] Assignees: Matsushita Electric Industrial Co., Ltd., Osaka, Japan; Halo LSI Design and Device Technologies, Inc., Wappingers Falls, N.Y.

[21] Appl. No.: 09/000,848

[22] Filed: Dec. 30, 1997

[51] Int. Cl.[7] .......................... H01L 29/788; H01L 29/76
[52] U.S. Cl. .......................... 257/315; 257/316; 257/344
[58] Field of Search .................. 257/315, 316, 257/317, 344, 408; 438/259

[56] References Cited

U.S. PATENT DOCUMENTS

| | | | |
|---|---|---|---|
| 5,337,274 | 8/1994 | Ohji | 257/316 |
| 5,414,287 | 5/1995 | Hong | 257/316 |
| 5,656,839 | 8/1997 | Komori et al. | 257/316 |
| 5,719,425 | 2/1998 | Akram et al. | 257/344 |
| 5,747,849 | 5/1998 | Kuroda et al. | 257/316 |
| 5,780,341 | 7/1998 | Ogura | 438/259 |

FOREIGN PATENT DOCUMENTS

| | | | |
|---|---|---|---|
| 53-53983 | 5/1978 | Japan | 257/316 |
| 56-90564 | 7/1981 | Japan | 257/316 |
| 60-038881 | 2/1985 | Japan | 257/316 |
| 63-058876 | 3/1988 | Japan | 257/316 |
| 63-285966 | 11/1988 | Japan | 257/316 |
| 1-140775 | 6/1989 | Japan | 257/316 |
| 1-191480 | 8/1989 | Japan | 257/316 |
| 1-291470 | 11/1989 | Japan | 257/316 |
| 06120516 | 4/1994 | Japan | 257/316 |
| 07115142 | 5/1995 | Japan | 257/316 |
| 07130886 | 5/1995 | Japan | 257/316 |
| 8-227944 | 9/1996 | Japan | 257/316 |
| 10-65160 | 3/1998 | Japan | 257/316 |
| 10-107166 | 4/1998 | Japan | 257/316 |

OTHER PUBLICATIONS

S. Mukherjee, et al., "A Single Transistor EEPROM Cell and its Implementation in a 512K CMOS EEPROM", IEEE IEDM 1985 Technical Digest, pp. 616–619, Dec. 1–4, 1985.

H. Kume, et al., A Flash–Erase EEPROM Cell with an Asymmetric Source and Drain Structure, IEEE IEDM 1987 Technical Digest, pp. 560–563, Dec. 6–9, 1987.

*Primary Examiner*—Steven H. Loke

[57] ABSTRACT

The nonvolatile semiconductor memory device of the present invention includes: a semiconductor substrate having a surface including a first surface region at a first level, a second surface region at a second level lower than the first level, and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; a second insulating film formed on the floating gate; and a control gate which is capacitively coupled to the floating gate via the second insulating film. The drain region includes a low-concentration impurity layer which is formed in the second surface region and which has one end extending toward the step side region, and a high-concentration impurity layer which is connected to the low-concentration impurity layer and which is formed in a region distant from the channel region. As impurity concentration of the low-concentration impurity layer is lower than an impurity concentration of the high-concentration impurity layer. The floating gate covers the step side region and at least a part of the low-concentration impurity layer via the first insulating film.

11 Claims, 22 Drawing Sheets

NONVOLATILE SEMICONDUCTOR MEMORY DEVICE AND METHOD FOR FABRICATING THE SAME AND SEMICONDUCTOR INTEGRATED CIRCUIT

BACKGROUND OF THE INVENTION

1. Field of the Invention

The present invention relates to a nonvolatile semiconductor memory device and a method for fabricating the same, and a semiconductor integrated circuit.

2. Description of the Related Art

In various kinds of memory devices for portable units and various kinds of memory-incorporated logic VLSI's, the technologies for nonvolatile memory devices have recently become increasingly important because it is an urgent task to reduce the costs per bit, while further enhancing the electrical write functions thereof. In order to develop such a high-performance device with a reduced cost, various structures and fabrication processes have been suggested.

Hereinafter, examples of conventional nonvolatile semiconductor memory devices will be described.

FIG. 21 shows the cross section of a nonvolatile semiconductor memory device having a so-called "stack-type" structure. Such a structure was suggested by S. Mukherjee, et al. in IEEE IEDEM 1985, Technical Digest, p. 616.

In the device shown in FIG. 21, a tunnel oxide film 102, a floating gate 103, a capacitive insulating film 104 and a control gate 105 are stacked in this order on a semiconductor substrate 101. In the surface of the semiconductor substrate 101, a source region 106 and a drain region 107, which have been doped with an impurity having a high concentration, are formed. The region between the source region 106 and the drain region 107 functions as a channel region. The floating gate 103 is formed so as to overlap the channel region. This nonvolatile semiconductor memory device has a "stacked gate structure" in which the control gate 105 is disposed over the floating gate 103 which is covered with oxide films in the periphery thereof. The floating gate 103 functions as a node in which information is stored and the stored information is variable between "0" and "1" depending upon the charged states thereof. The threshold voltage of a transistor as viewed from the control gate 105 is varied in accordance with the amount of charge accumulated in the floating gate 103. By utilizing this phenomenon, the read of data is performed. On the other hand, the write of data is performed by utilizing the phenomenon that channel hot electrons, which have obtained high energy as a result of the acceleration caused by a high electric field in a lateral direction within an inversion layer of the channel, are injected into the tunnel oxide film 102 so as to reach the floating gate 103. As will be described later, the efficiency with which the electrons, which have obtained high energy as a result of the acceleration caused by a high electric field in a lateral direction within an inversion layer of the channel, are injected into the tunnel oxide film 102 is extremely low. Thus, the write efficiency is also low. A high channel doping concentration is required to improve the write efficiency, resulting in the high threshold voltage and read current. The erasure of data is performed by taking out the electrons in the floating gate 103 into the source region 106 in accordance with a Fowler-Nordheim (FN) tunneling phenomenon. In order to utilize the FN tunneling phenomenon, a high electric field of about 10.5 V/cm to about 11 V/cm is required to be formed in the tunnel oxide film 102. Thus, when data is erased, the control gate 105 is grounded (0 V) and a high voltage of about 15 V is applied to the source region 106, for example.

FIG. 22 shows the cross section of a nonvolatile semiconductor memory device which has been suggested in order to suppress the decrease in cell operation margin when data is erased. Such a device is disclosed by H. Kume, et al. in IEEE IEDEM 1987, Technical Digest, p. 560.

In the device shown in FIG. 22, a tunnel oxide film 202, a floating gate 203, a capacitive insulating film 204 and a control gate 205 are stacked in this order on a semiconductor substrate 201. In the surface of the semiconductor substrate 201, a high-concentration source region 206 and a high-concentration drain region 207, which have been doped with an impurity having a high concentration, are formed. In addition, an n⁻type low-concentration impurity layer 208 and a p⁺-type high-concentration impurity layer 209 are formed so as to cover the n⁺-type high-concentration source region 206 and the n⁺-type high-concentration drain region 207, respectively. The region between the n⁻type low-concentration impurity layer 208 and the n⁺-type high-concentration drain region 207 functions as a channel region. The floating gate 203 is formed so as to overlap the channel region and the ends of the floating gate 203 overlap a part of the high-concentration source region 206 and a part of the high-concentration drain region 207, respectively.

This device has an electric field weakening source structure. Thus, in erasing data, it is possible to suppress the generation of electrons and holes resulting from a band-to-band tunnel in the vicinity of the channel region, thereby reducing the amount of holes injected into the tunnel oxide film 202. As a result, it is possible to prevent the holes from being trapped in the tunnel oxide film 202 and it is also possible to prevent interface states from being generated, thereby reducing a variation in erasure characteristics and preventing a degradation of a retention margin and a write disturb margin.

FIG. 23 shows the cross section of a nonvolatile semiconductor memory device which is designed to shorten a write time or to reduce a write voltage by increasing a write efficiency. This device is disclosed by Nakao, et al. in Japanese Laid-Open Publication No. 7-115142.

The device shown in FIG. 23 uses a semiconductor substrate 301 with a step 302 formed on the surface thereof. The surface of the semiconductor substrate 301 is divided by this step 302 into a surface region at a relatively high level (first surface region) and a surface region at a relatively low level (second surface region). A tunnel oxide film 303, a floating gate 304, a capacitive insulating film 305 and a control gate 306 are stacked in this order over the step 302. In the surface of the semiconductor substrate 301, a high-concentration source region 307 and a high-concentration drain region 308, which have been doped with an impurity having a high concentration, are formed. A high-concentration impurity layer 309 having a small thickness of about 0.1 μm or less extends from the high-concentration drain region 308 along the side of the step 302 to reach the first surface region. Since the high-concentration impurity layer 309 functions as a drain region, a region between the high-concentration source region 307 and the high-concentration impurity layer 309 functions as a channel region. The floating gate 304 is formed so as to overlap the channel region and to cover the high-concentration impurity layer 309.

In such a structure, since the floating gate 304 is located in the direction of velocity vectors of channel hot electrons, the channel hot electron injection efficiency is presumably increased.

Next, a method for fabricating the nonvolatile semiconductor memory device shown in FIG. 23 will be described with reference to FIGS. 24A to 24E.

First, as shown in FIG. 24A, an oxide film 311 is formed as a mask for forming a step in the semiconductor substrate 301 mad e of p-type silicon. Thereafter, a part of the oxide film 311 in the region where the step is to be formed is etched by a commonly used patterning technique. Then, the semiconductor substrate 301 is etched by using the oxide film 311 as a mask, thereby forming a step in the surface of the semiconductor substrate 301. Subsequently, arsenic (As) ions are implanted into the whole of the step side region and the second surface region at a relatively high dose of about $1.0 \times 10^{15}$ cm$^{-2}$ and with an acceleration energy of about 20 keV. This ion implantation is performed by a large-angle-tilt ion implantation technique in which the implantation angle is set at about 30 degrees. As a result, as shown in FIG. 24B, the high-concentration impurity layer 309 having a small thickness is formed in the whole of the step side region and the second surface region. As described in the above-cited document, the high-concentration impurity layer 309 thermally diffuses during the fabrication process and the resulting thickness thereof after the fabrication process is completed becomes about 0.05 μm. Next, as shown in FIG. 24C, the oxide film 311 is removed and then the surface of the semiconductor substrate 301 is thermally oxidized, thereby forming the tunnel oxide film 303 as a first insulating film having a thickness of about 10 nm. Furthermore, a CVD poly-silicon film having a thickness of about 200 nm is deposited thereon, thereby forming the floating gate 304. A second insulating film 305 (thickness: about 20 nm) functioning as a capacitive insulating film is formed on the floating gate 304 by thermally oxidizing the surface of the floating gate 304. Thereafter, a CVD poly-silicon film having a thickness of about 200 nm is deposited thereon, thereby forming the control gate 306.

Subsequently, the floating gate 304, the capacitive insulating film 305 and the control gate 306 are patterned as shown in FIG. 24D. Finally, as shown in FIG. 24E, As ions are implanted into the semiconductor substrate 301 at a dose of about $3.0 \times 10^{15}$ cm$^{-2}$ and with an acceleration energy of about 50 keV, thereby forming the high-concentration source region 307 and the high-concentration drain region 308.

The conventional nonvolatile semiconductor memory devices have the following problems.

In the structure shown in FIG. 21, the conditions for making electrons obtain high energy do not match with the conditions for efficiently injecting electrons into the oxide film. As a result, the injection efficiency (i.e., the ratio of injected current to consumed power) becomes as low as about $10^{-6}$. Thus, a large amount of data cannot be written in parallel into such a structure in the case of performing a page mode write operation, for example, and the resulting data transfer rate becomes low. The time required for such a device to rewrite data is about 10 μs, which is extremely longer than the rewrite time required for a DRAM, an SRAM or the like.

Since the structures shown in FIGS. 21 and 22 utilize the FN tunneling phenomenon for erasing data, an abrupt band bending and a high electric field are generated at the edge of the source region in the vicinity of the surface thereof. The abrupt band bending and the high electric field in turn causes a band-to-band tunneling current, so that the generated holes are injected into the oxide film. As a result, a variation is adversely caused in erasure characteristics and a retention margin and a write disturb margin are degraded. Particularly when a large amount of data is simultaneously erased from a large number of nonvolatile memory cells included within a large block, it takes a time 100 times or more as long as the time required for one-bit erasure. Thus, in a memory cell having a weak resistance, the retention margin is seriously degraded.

In the structure shown in FIG. 22, the variation in erasure characteristics and the degradation of a retention margin and a write disturb margin can be suppressed. However, since the structure uses a low-concentration source diffusion layer, the effective channel length thereof is decreased, which makes it impossible to greatly reduce the size of a cell. In addition, even when the drain voltage is restricted to about 1.5 V during the read of data, it is still impossible to suppress the read disturb margin from being degraded.

Furthermore, none of the above-described conventional examples can employ a circuit configuration for erasing data by taking out electrons from a floating gate into a drain region by utilizing the FN tunneling phenomenon. Such a circuit configuration is advantageous in stabilizing the sensing operation and realizing a high speed access. However, it is necessary to weaken a drain electric field in order to suppress the generation of a band-to-band tunnel during an erasure operation. Weakening the drain electric field considerably decreases the electron injection efficiency during a write operation.

In the nonvolatile semiconductor memory device shown in FIG. 23, since the floating gate 304 is formed in the direction of the velocity vectors of channel hot electrons, the channel hot electron injection efficiency is allegedly increased. For such a purpose, a thin drain layer 309 is formed as a high-concentration impurity layer having a uniform impurity concentration so as to uniformly cover the side of the step by implanting As ions by a large-angle-tilt ion implantation in which the implantation angle is set at about 30 degrees, the acceleration energy is set at as low as about 20 keV and the dose is set at about $1.0 \times 10^{15}$ cm$^{-2}$. The resulting impurity concentration of the high-concentration impurity layer becomes as high as about $1.0 \times 10^{20}$ cm$^{-3}$.

However, in the structure shown in FIG. 23 in which the high-concentration drain layer 309 reaches the surface of the upper part of the step, the electron injection efficiency cannot be increased and the variation in erasure characteristics and the degradation of the write disturb margin and the read disturb margin cannot be suppressed. The reasons thereof are as follows. At the edge of the high-concentration drain layer 309, a drain potential, which has been applied to the drain region in a corner portion in the upper part of the step, can be retained. However, the electric field intensity in the horizontal direction dramatically decreases in the high-concentration drain layer 309 and the energy of hot electrons decreases in the interface between the step side region and the semiconductor substrate. Though some distance is generated by the non-equilibrium transportation of the electrons between the position of the peak of electric field and the position of an average energy peak of electrons, the distance is approximately on the order of a mean free path. In a silicon crystal, the difference is about 10 nm. As the difference between the set thickness of the thin drain layer and this distance increases, the energy of electrons in the silicon interface in the step side region exponentially decreases so that the electron injection efficiency is decreased. That is to say, this structure requires a drain layer having an extremely small thickness. Furthermore, in the high-concentration drain layer, the hot electrons come into contact with the electrons in a thermal equilibrium state, thereby scattering the electrons, making the direction of the electron velocity vectors less aligned with the direction of the electric field and decreasing the electron injection efficiency. Thus, for example, if the impurity concentration within the drain layer is uniformly decreased so as to suppress the scattering of electrons within the drain layer, then the drain potential drops in the extremely thin drain layer formed along the side and the bottom of the step, the drain potential also drops in the corner portion in the upper part of the step and the electric field intensity decreases in the horizontal direction between the drain layer and the channel. As a result, the electron injection efficiency also decreases in the step side region.

Moreover, in this structure, it is also impossible to erase data by taking out electrons from the floating gate into the drain layer by utilizing the FN-type tunneling phenomenon. Since the high-concentration drain layer is in contact with the channel region, it is necessary to form an electric field weakening diffusion layer, for example, around the high-concentration drain region in order to suppress the generation of the band-to-band tunnel during an erasure operation. However, in such a case, the electron injection efficiency is extremely decreased during a write operation, and such a structure cannot be fabricated at a very small size because of a short channel effect.

Furthermore, even when the drain voltage is restricted to about 1.5 V during a read operation, the read disturb margin is degraded by the thin high-concentration drain layer.

SUMMARY OF THE INVENTION

The nonvolatile semiconductor memory device of the present invention includes: a semiconductor substrate having a surface including a first surface region at a first level, a second surface region at a second level lower than the first level, and a step side region linking the first surface region and the second surface region together; a channel region formed in the first surface region of the semiconductor substrate; a source region and a drain region which are formed in the surface of the semiconductor substrate so as to interpose the channel region therebetween;

a first insulating film formed on the surface of the semiconductor substrate; a floating gate formed on the first insulating film; a second insulating film formed on the floating gate; and a control gate which is capacitively coupled to the floating gate via the second insulating film. The drain region includes a low-concentration impurity layer which is formed in the second surface region and which has one end extending toward the step side region, and a high-concentration impurity layer which is connected to the low-concentration impurity layer and which is formed in a region distant from the channel region. An impurity concentration of the low-concentration impurity layer is lower than an impurity concentration of the high-concentration impurity layer, and the floating gate covers the step side region and at least a part of the low-concentration impurity layer via the first insulating film.

The nonvolatile semiconductor memory device according to another aspect of the present invention includes a semiconductor substrate with a concave portion formed in a surface thereof, and a floating gate having a surface facing a corner portion between a bottom of the concave portion and a side of the concave portion. When data is written, hot electrons are generated inside the semiconductor substrate and at least a part of the hot electrons are injected from the corner portion of the concave portion into the floating gate.

According to still another aspect of the present invention, a method for fabricating a nonvolatile semiconductor memory device is provided. The method includes the steps of: doping an active region of a surface of a semiconductor substrate, including a portion to be a source region, a portion to be a channel region and a portion to be a drain region, with an impurity for the channel-region; covering the surface of the semiconductor substrate with a mask having an opening through which at least a part of the portion to be the drain region is exposed; etching a part of the active region through the opening of the mask, thereby forming a concave portion in the active region; doping an impurity for the drain region into the concave portion in the active region through the opening of the mask, thereby forming a low-concentration impurity layer, functioning as a part of the drain region; forming a first insulating film on the surface of the active region; forming a floating gate on the first insulating film so as to cover the portion to be the channel region, a side of the concave portion and at least a part of the bottom of the concave portion; forming a second insulating film on the floating gate; forming a control gate which is capacitively coupled to the floating gate via the second insulating film; and doping an impurity into a part of the active region by using the floating gate and the control gate as a mask, thereby forming a high-concentration impurity layer functioning as a part of the drain region and having an impurity concentration higher than an impurity concentration of the low-concentration impurity layer, and forming a high-concentration impurity layer functioning as the source region.

The semiconductor integrated circuit according to still another aspect of the present invention includes: a plurality of nonvolatile memory cells; a semiconductor substrate having a surface including a first surface region at a first level, a second surface region at a second level lower than the first level, and a step side region linking the first surface region and the second surface region together; and a driver circuit, formed on the semiconductor substrate, for driving the plurality of nonvolatile memory cells. Each of the plurality of nonvolatile memory cells includes: a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; a second insulating film formed on the floating gate; and a control gate which is capacitively coupled to the floating gate via the second insulating film. The drain region includes a low-concentration impurity layer which is formed in the second surface region and which has one end extending toward the step side region, and a high-concentration impurity layer which is connected to the low-concentration impurity layer and which is formed in a region distant from the channel region. An impurity concentration of the low-concentration impurity layer is lower than an impurity concentration of the high-concentration impurity layer, and the floating gate covers the step side region and at least a part of the low-concentration impurity layer via the first insulating film.

Thus, the invention described herein makes possible the advantages of (1) providing a nonvolatile semiconductor memory device which can remarkably increase an electron injection efficiency, thereby enabling a high speed write operation while reducing the power consumption thereof, (2) providing a nonvolatile semiconductor memory device which can erase data by taking out electrons from a floating gate into a drain region, (3) providing a nonvolatile semiconductor memory device which can improve the erasure characteristics by suppressing the injection of the holes into an oxide film when data is erased, (4) providing a nonvolatile semiconductor memory device which can increase read current, can suppress the degradation of a read disturb margin, and can further increase a read rate in a circuit configuration in which a source bias and a drain bias are exchanged when data is randomly read out, (5) providing a method for fabricating such a nonvolatile semiconductor memory device, and (6) providing a semiconductor integrated circuit including such a nonvolatile semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

Embodiment 1

Figure 1A:
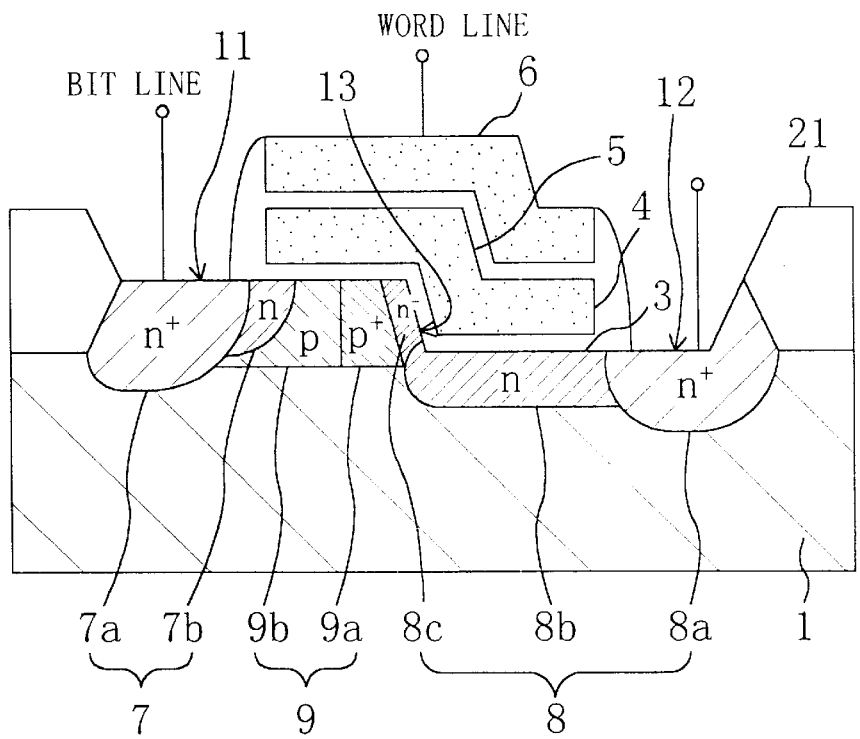
FIG. 1A is a cross-sectional view showing the first embodiment of the nonvolatile semiconductor memory device of the present invention.
Figure 1B:
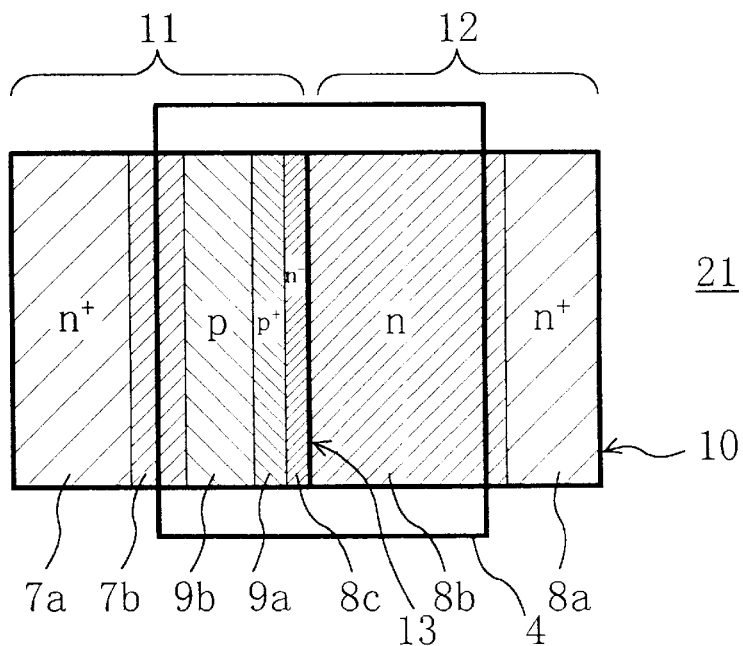
FIG. 1B is a plan view showing a planar layout thereof.

FIG. 1A shows the cross section of the first embodiment of the nonvolatile semiconductor memory device of the present invention. FIG. 1B shows a planar layout of the main components thereof. A single nonvolatile memory is illustrated in FIGS. 1A and 1B for the sake of simplicity. However, in actuality, a large number of nonvolatile memories having such a configuration are arranged on one and same substrate.

As shown in FIG. 1A, the nonvolatile semiconductor memory device of this embodiment includes a semiconductor substrate 1 (p-type silicon substrate) with an element isolation layer 21 formed on the surface thereof. In a region (active region) of the surface of the substrate 1 excluding the region where the element isolation layer 21 is formed, a step is formed. The surface of the substrate 1 is divided by this step into a surface region at a relatively high level (first surface region) and a surface region at a relatively low level (second surface region). The level difference (height of the step) between the first surface region 11 and the second surface region 12 is, for example, in the range from about 50 nm to about 70 nm, more preferably in the range from about 20 nm to about 150 nm.

In this specification, the first surface region 11 will sometimes be referred to as an "upper part of the step" and the second surface region 12 will sometimes be referred to as a "bottom of the step". The surface region between the first surface region 11 and the second surface region 12 will be referred to as a "step side region" 13.

The first surface region 11 and the second surface region 12 are linked together by the step side region 13. In the cross-sectional view illustrated in FIG. 1A, the step side region 13 is shown as a side inclined at a certain angle. Alternatively, the step side region 13 may be a surface having a curvature or may be substantially vertical to the second surface region 12, as will be described later.

On the surface of the semiconductor substrate 1, a tunnel oxide film (first insulating film) 3 is formed in a region ranging from the first surface region 11 to the second surface region 12 via the step side region 13. On the tunnel oxide film 3, a floating gate 4, a capacitive insulating film 5, and a control gate 6 are stacked in this order over the surface of the substrate 1. The floating gate 4 is capacitively coupled to the control gate 6 via the capacitive insulating film 5. The control gate 6 is either connected to a word line or patterned such that the control gate 6 itself functions as a word line. The floating gate 4 has a surface (convex surface) facing the step side region 13 and the second surface region 12 via the tunnel oxide film 3.

In the surface of the semiconductor substrate 1, a source region 7 is formed in the first surface region 11, a drain region 8 is formed in the second surface region 12, and a channel region 9 is formed so as to be interposed between the source region 7 and the drain region 8 in the first surface region 11.

Next, the configurations of the source region 7, the drain region 8 and the channel region 9 will be described in more detail.

The drain region 8 includes: a high-concentration impurity layer 8a formed in the second surface region 12; a low-concentration impurity layer 8b formed in the second surface region 12; and an extremely-low-concentration impurity layer 8c formed in the step side region 13. The extremely-low-concentration impurity layer 8c is electrically connected to the high-concentration impurity layer 8a via the low-concentration impurity layer 8b. The high-concentration impurity layer 8a is connected to a wire (not shown). In this specification, the high-concentration impurity layer 8a, the low-concentration impurity layer 8b and the extremely-low-concentration impurity layer 8c of the drain region 8 will sometimes be referred to as a high-concentration drain region 8a, a low-concentration drain region 8b and an extremely-low-concentration drain region 8c, respectively.

The impurity concentration of the extremely-low-concentration drain region 8c is lower than the impurity concentration of the low-concentration drain region 8b, and the impurity concentration of the low-concentration drain region 8b is lower than the impurity concentration of the high-concentration drain region 8a. In addition, as shown in FIG. 1A, the thickness of the extremely-low-concentration drain region 8c is smaller than the thickness of the low-concentration drain region 8b, and the thickness of the low-concentration drain region 8b is smaller than the thickness of the high-concentration drain region 8a.

In this embodiment, the low-concentration drain region 8b extends from the high-concentration drain region 8a to a corner is portion between the second surface region 12 and the step side region 13 so as to entirely cover the corner portion. As a result, in the corner portion between the second surface region 12 and the step side region 13, the stepped lower surface of the floating gate 4 faces one end of the low-concentration drain region 8b. On the other hand, a majority of the low-concentration drain region 8b faces the bottom surface of the floating gate 4 via the tunnel oxide film 3.

The source region 7 formed in the first surface region 11 includes a high-concentration impurity layer 7a and a low-concentration impurity layer 7b having an impurity concentration lower than that of the high-concentration impurity layer 7a. The low-concentration impurity layer 7b is provided between the high-concentration impurity layer 7a and the channel region 9 and faces an edge portion of the floating gate 4 via the tunnel oxide film 3. As shown in FIG. 1A, the source region 7 is connected to a bit line. In this specification, the high-concentration impurity layer 7a and the low-concentration impurity layer 7b of the source region 7 will sometimes be referred to as a high-concentration source region 7a and a low-concentration source region 7b, respectively.

The channel region 9 includes a low-concentration impurity layer 9b formed in a region adjacent to the source region 7 and a high-concentration impurity layer 9a formed in a region adjacent to the drain region 8. The impurity concentration in the channel region 9 is asymmetric along the channel direction. Such a channel as having an asymmetric impurity concentration along the channel direction will be referred to as an "asymmetric channel". In this specification, the high-concentration impurity layer 9a and the low-concentration impurity layer 9b of the channel region 9 will sometimes be referred to as a high-concentration channel region 9a and a low-concentration channel region 9b, respectively.

As shown in FIG. 1B, a rectangular active region 10 is formed so as to be surrounded by the element isolation layer 21. However, it is noted that the shape of the active region 10 is not limited to the illustrated one. As described above, the active region 10 is divided by the step side region 13 into the first surface region 11 and the second surface region 12. The floating gate 4 is formed so as to overlap the step side region 13 and partially covers both the first surface region 11 and the second surface region 12. In the active region 10, a pair of n-type high-concentration impurity layers ($n^+$ layers) are formed in regions other than the region covered with the floating gate 4 and function as the high-concentration source region 7a and the high-concentration drain region 8a, respectively. Inside the region covered with the floating gate 4, the low-concentration drain region 8b, the extremely-low-concentration drain region 8c, the high-concentration channel region 9a and the low-concentration channel region 9b are disposed. It is noted that the n-type high-concentration impurity layers ($n^+$ layers) functioning as the high-concentration source region 7a and the high-concentration drain region 8a are separated from the floating gate 4 by insulating side walls formed on the sides of the floating gate 4 and the control gate 6.

As can be seen from FIG. 1B, the floating gate 4 has an isolated pattern and thus is electrically isolated from the floating gates of the other nonvolatile memories (not shown). However, unlike the floating gate 4, the control gate 6 is not always required to have an isolated pattern, but may be configured so as to be integrated with the word line.

Next, exemplary operations of the device of this embodiment for writing, reading and erasing data will be briefly described.

First, in writing data, a voltage of about 7 V is applied to the control gate 6, a voltage of about 0 V is applied to the source region 7, and a voltage of about 5 V is applied to the drain region 8. Then, hot electrons are generated in the channel region 9 and are injected into the floating gate 4. The write of data is performed in this manner.

In reading data, a voltage of about 3.3 V is applied to the control gate 6, a voltage of about 1.5 V is applied to the source region 7, and a voltage of about 0 V is applied to the drain region 8.

In erasing data, a voltage of about −5 V is applied to the control gate 6 and a voltage of about 6 V is applied to the drain region 8, thereby taking out the electrons accumulated in the floating gate 4 into the drain region 8 via the tunnel oxide film 3. The electrons pass through the tunnel oxide film 3 based on the FN tunneling phenomenon.

The nonvolatile semiconductor memory device shown in FIGS. 1A and 1B are principally characterized in (1) that the drain region 8 has a triple structure consisting of the high-concentration drain region 8a, the low-concentration drain region 8b and the extremely-low-concentration drain region 8a, (2) that the low-concentration drain region 8b is formed so as to cover the corner portion at the bottom of the step, and (3) that the extremely-low-concentration drain region 8a is formed in the step side region 13.

Since this device has such a drain structure, when a voltage of about 5 V is applied to the drain region 8 in writing data, the extremely-low-concentration drain region 8c is depleted. In this case, since the low-concentration drain region 8b has a higher impurity concentration than that of the extremely-low-concentration drain region 8a, only a part of the low-concentration drain region 8b (i.e., a part adjacent to the extremely-low-concentration drain region 8c) is depleted. As a result, a high electric field is formed in the corner portion between the second surface region 12 and the step side region 13 (in this specification, such a portion will sometimes be simply referred to as a "step bottom corner"). In this case, a voltage almost as high as the voltage applied to the drain region 8 (i.e., a drain voltage) is applied to the floating gate 4. However, since the floating gate 4 has a shape corresponding to the shape of the step bottom corner, the effect of the floating gate 4 weakening the electric field intensity of the drain region 8 is reduced. As a result, in the structure shown in FIG. 1A, a high electric field is formed upon the application of a low drain voltage. This effect is further enhanced if a part of the tunnel oxide film 3 over the step side region 13 is thicker than the other parts thereof. In addition, since the electrons flow while making a detour around the corner portion, the conditions for making the electrons obtain high energy match with the conditions for injecting the electrons into the floating gate 4, thereby considerably increasing the electron injection efficiency in the step bottom corner. If the step bottom corner is a surface having a relatively large curvature, then the conditions for making the electrons obtain high energy more satisfactorily match with the conditions for injecting the electrons into the floating gate 4, thereby further increasing the electron injection efficiency.

When a voltage is applied to the high-concentration drain region 8a, the extremely-low-concentration drain region 8c heightens the potential in the corner portion in upper part of the step. In addition, when data is erased by taking out the electrons from the floating gate 4 into the drain region 8 by utilizing the FN tunneling phenomenon of the tunnel oxide film 3, the extremely-low-concentration drain region 8c prevents an abrupt band bend and a high electric field from being generated in the vicinity of the floating gate 4 even when a negative bias is applied to the floating gate 4. As a result, it is possible to suppress the phenomenon that the holes generated in a band-to-band tunnel are injected into the oxide film.

Another feature of the device of this embodiment consists in that an "asymmetric channel" is formed in the channel region 9. More specifically, the impurity concentration in the channel region 9 is high in the region adjacent to the extremely-low-concentration drain region 8c and becomes gradually lower as it is closer to the source region 7. The high-concentration channel region 9a formed in the vicinity of the extremely-low-concentration impurity layer 8c increases the intensity of a channel horizontal electric field formed in the first surface region 11. As a result, the conditions for making the electrons obtain high energy more satisfactorily match with the conditions for injecting the electrons into the floating gate 4, thereby injecting the electrons from the step side region 13 into the floating gate 4 with a higher efficiency. In other words, such a structure can cause the injection of the electrons in the step bottom corner, thereby increasing the electron injection efficiency in the step side region and remarkably increasing the resulting electron injection efficiency as a whole.

Moreover, since the extremely-low-concentration drain region 8a and the low-concentration drain region 8b face the floating gate 4 over a wide range, the data erasure of taking the electrons from the floating gate 4 into the drain region 8 can be performed efficiently. In performing data erasure of such a type, even when a high bias is applied to the drain region 8 and a negative bias is applied to the floating gate 4 in order to erase data, it is possible to suppress the injection of the holes into the tunnel oxide film 3. As a result, the data erasure characteristics can be improved.

Next, an exemplary method for fabricating the nonvolatile semiconductor memory device shown in FIGS. 1A and 1B will be described with reference to FIG. 2A through FIG. 5C.

Figure 2A:
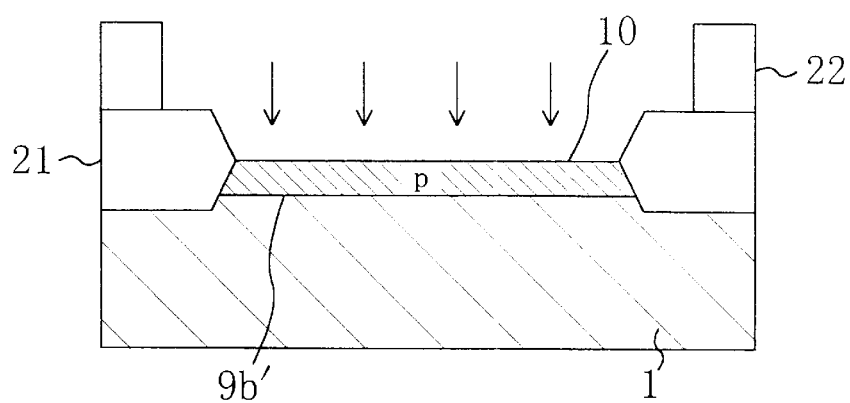
FIGS. 2A to 2C are cross-sectional views showing the respective process steps for fabricating the device shown in FIGS. 1A and 1B.

First, as shown in FIG. 2A, an element isolation layer 21 is formed on the surface of a p-type silicon substrate 1. The region of the surface of the substrate 1, where the element isolation layer 21 is not formed, becomes an active region 10. After a protective oxide film (not shown) is formed by a thermal oxidization method over the active region 10, the surface of the substrate 1 is covered with a resist mask 22. The resist mask 22 is a mask for doping an impurity (p-type impurity) to form the channel region 9 and is patterned so as not to cover the region into which the impurity should be implanted. Thereafter, boron (B) ions (p-type impurity ions) are implanted into the active region 10 under the conditions where the acceleration energy is set at about 30 keV and the low dose is set at about $5 \times 10^{12}$ cm$^{-2}$. This ion implantation is performed in order to control a threshold voltage. As a result, a player 9b', including the region to be the low-concentration channel region 9b, is formed in the entire surface of the active region 10.

Figure 2B:
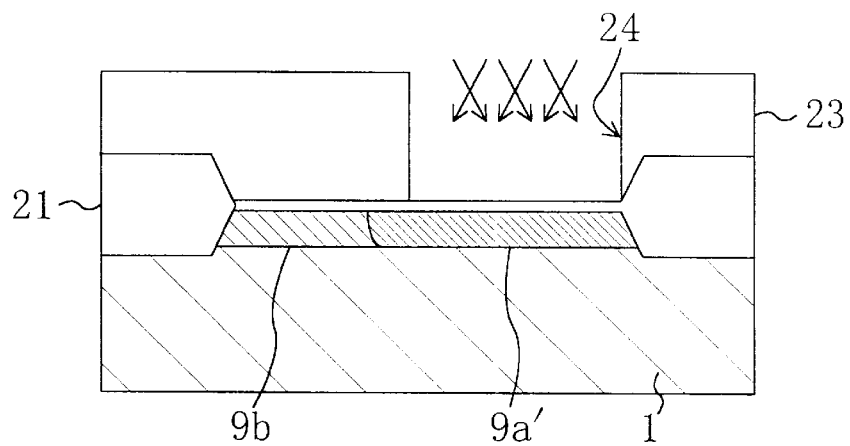

Next, as shown in FIG. 2B, a resist mask 23 having an opening 24 for exposing a part of the active region 10 is formed over the substrate 1. The location and the planar shape of the opening 24 substantially define the location and the planar shape of the concave portion to be formed in the surface of the substrate 1 later. The opening 24 of the resist mask 23, for example, has such a planar shape as that shown in FIG. 3A.

In this embodiment, before the concave portion is formed in the surface of the substrate 1, a doping for forming an asymmetric channel is performed. Specifically, BF$_2$ ions are implanted through the opening 24 of the resist mask 23 into the substrate 1 under the conditions where the dose is set at about $1.5 \times 10^{14}$ cm$^{-2}$ and the acceleration energy is set at a low value of about 45 keV. In this case, by setting the implantation angle at about 20° in accordance with a large-angle-tilt ion implantation technique, the ions are implanted into the region below the edge of the resist mask 23 through the opening 24 of the resist mask 23. By performing this ion implantation, a p$^+$ layer 9a' including the region to be the high-concentration channel region 9a is formed as a shallow layer under the surface of the substrate 1. In the region where the p$^+$ layer 9a' is not formed, the p layer 9b' functions as the low-concentration impurity layer 9b of the channel region 9.

Figure 2C:
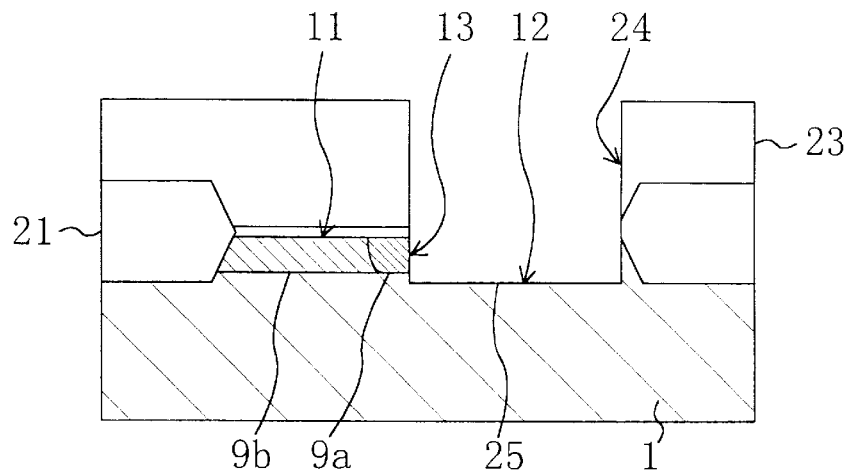

Thereafter, as shown in FIG. 2C, the surface of the substrate 1 is etched by about 50 nm to about 70 nm by using the resist mask 23 as an etching mask, thereby forming the concave portion 25 in the surface of the substrate 1. In this embodiment, by forming the concave portion 25, a step structure is provided for the surface of the substrate 1. However, the method for forming a step in the active region 10 of the substrate 1 is not limited to this method for forming the concave portion 25 in the active region 10.

Figure 6:
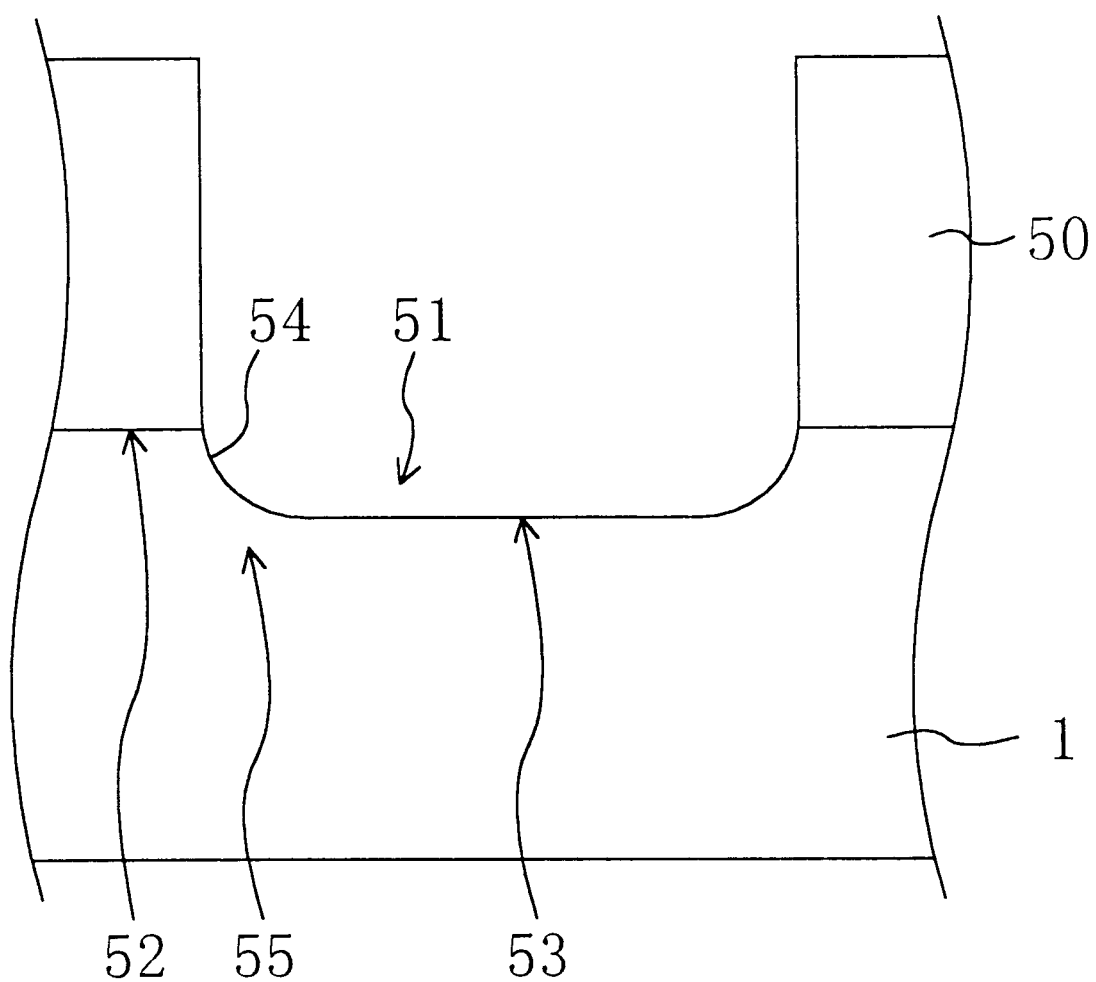
FIG. 6 is a schematic cross-sectional view showing a concave portion, formed in the surface of a silicon substrate by a chemical dry etching process, based on a photograph obtained by a scanning electron microscopy (SEM).

The etching for forming the concave portion 25 in the active region 10 is preferably performed by a method which is less likely to do much damage to the substrate 1 (for example, by a chemical dry etching (CDE) process). In the CDE process, radicals of an etching gas are generated, and silicon is etched by producing a chemical reaction between the exposed surface of the silicon substrate 1 and the radicals. Thus, the CDE is less likely to do damage to the substrate 1. The cross section of the concave portion which has been formed by the CDE process under anisotropic conditions is shown in FIG. 6. FIG. 6 is a schematic cross-sectional view which has been drawn based on a photograph obtained by a scanning electron microscopy (SEM). As can be seen from FIG. 6, a concave portion 51 (having a depth of about 50 nm) is formed by performing the CDE process in the surface of the silicon substrate 1. This CDE process is performed by using a photo resist 50 as a mask. A corner portion 55 between the bottom surface (i.e., the second surface region 53) and a side (i.e., the step side region 54) of the concave portion 51 is a gently curved surface. Such a curved corner portion 55 can increase the efficiency with which the electrons are injected into the floating gate, as described above. In addition, it has been confirmed that a tunnel oxide film (not shown) formed by thermally oxidizing the side 54 and the bottom surface 53 of the concave portion 51 has a satisfactory film quality.

Figure 3A:
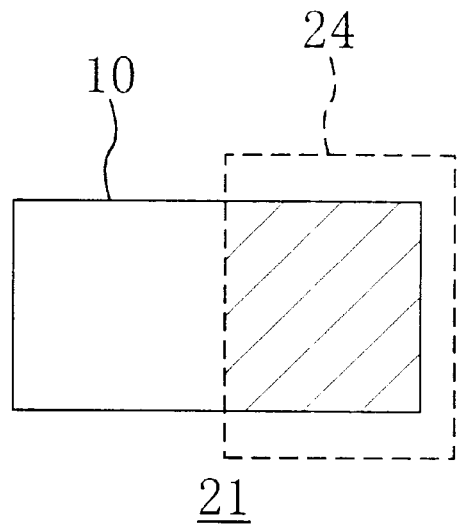
FIGS. 3A to 3C are plan views showing exemplary planar layouts of the opening of a mask for forming a concave portion.
Figure 3B:
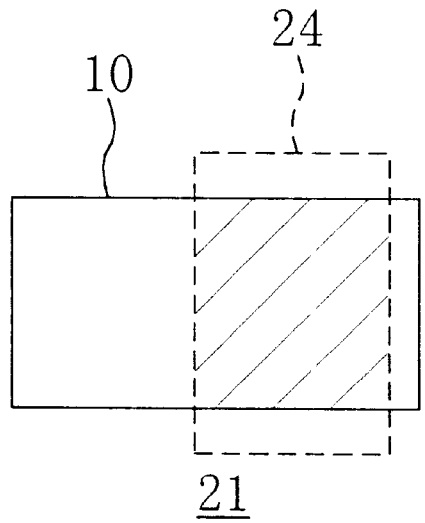
Figure 3C:
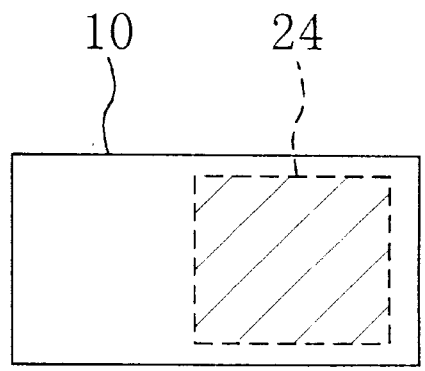

FIG. 3A will be referred to again. In the case of performing an etching for forming a concave portion by using the resist mask 23 having such an opening 24 as that shown in FIG. 3A, a part of the element isolation layer 21 is exposed through the opening 24. However, since such an etching is performing under the conditions defined for selectively etching silicon, the etching of the element isolation layer 21 is negligible. Strictly speaking, the surface of the silicon substrate 1 is etched by using the resist mask 23 and the element isolation layer 21 as a mask during this etching process. In the case shown in FIG. 3A, the hatched region is etched so that a surface (i.e., a bottom surface of the concave portion) having a level lower than that of the other region of the active region 10 comes into being. In the active region 10, the non-etched region becomes the "first surface region 11" and the etched region (hatched region) becomes the "second surface region 12". Of the inner side surfaces of the concave portion which have been formed by performing this etching process, an inner side surface located between the first surface region 11 and the second surface region 12 becomes the "step side region 13" linking these surface region together. It is noted that the layout of the opening 24 of the resist mask 23 is not limited to that shown in FIG. 3A, but may be such a layout as that shown in FIG. 3B or 3C.

Figure 4A:
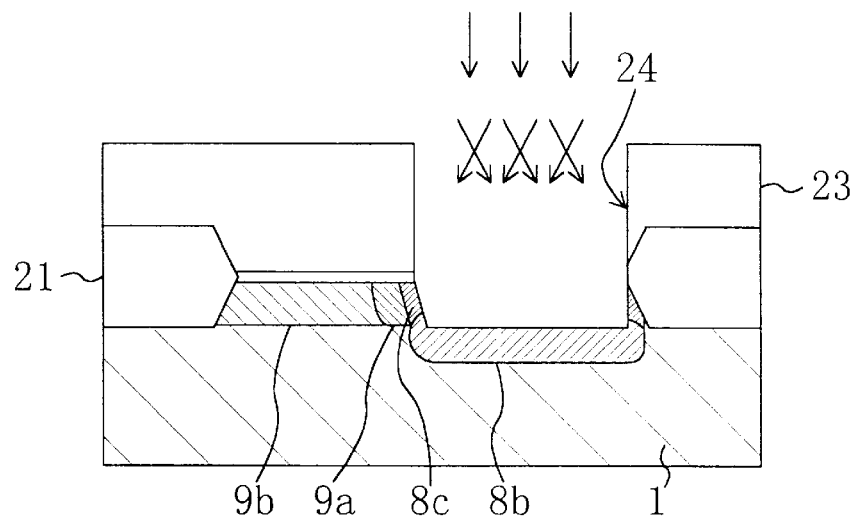
FIGS. 4A to 4C are cross-sectional views showing the respective process steps for fabricating the device shown in FIGS. 1A and 1B.

Next, as shown in FIG. 4A, a double ion implantation of arsenic (As) ions and phosphorous (P) ions is performed through the opening 24 of the resist mask 23. Specifically, the As ions are implanted into the concave portion of the substrate 1 under the conditions where the dose is set at about $1.0\times10^{14}$ cm$^{-2}$, the acceleration energy is set at a relatively high value of about 60 keV and the implantation angle is set at about 7 degrees, for example. In addition, the P ions are implanted into the concave portion of the substrate 1 under the conditions where the dose is set at a relatively low value of about $5.0\times10^{13}$ cm$^{-2}$, the acceleration energy is set at about 40 keV, and the implantation angle is set at about 0 degree, for example. By performing the As ion implantation with a relatively high energy and the P ion implantation at a relatively low dose in such a manner, the low-concentration drain region 8b is formed under the bottom surface of the concave portion and the extremely-low-concentration drain region 8c is formed in the step side region 13.

By performing the above-described ion implantation process and the below-described high-concentration source/drain implantation process, the drain region 8 having a triple structure consisting of the extremely-low-concentration drain region 8c, the low-concentration drain region 8b and the high-concentration drain region 8a is obtained and an asymmetric channel is formed in the first surface region 11.

The impurity concentration of the low-concentration drain region 8b is preferably set at such a value that the Fermi level in the drain region reaches 90% or more of Eg/2 (where Eg is the band gap of silicon). That is to say, the impurity concentration of the low-concentration drain region 8b is preferably set at such a value that a built-in voltage $V_{bi}$ becomes equal to or larger than about $0.55\times0.9=0.495$ (V). The built-in voltage $V_{bi}$ is given by the following Equation (1).

$$V_{bi}=(kT/q)\cdot\ln(Nd/ni) \qquad (1)$$

where k is a Boltzmann's constant, T is an absolute temperature [K], q is charge per electron, Nd is an impurity concentration of the low-concentration impurity layer 8b and ni is a carrier density of intrinsic semiconductor.

Since kT/q=0.0259 V and ni=$1.5\times10^{10}$ cm$^{-3}$ at room temperature (300 K), the value of Equation (1) becomes equal to or larger than 0.495 V when the impurity concentration Nd of the low-concentration drain region 8b is equal to or higher than about $3.0\times10^{18}$ cm$^{-3}$. Thus, it is preferable that the impurity concentration Nd of the low-concentration drain region 8b is equal to or higher than about $3.0\times10^{18}$ cm$^{-3}$.

Figure 4B:
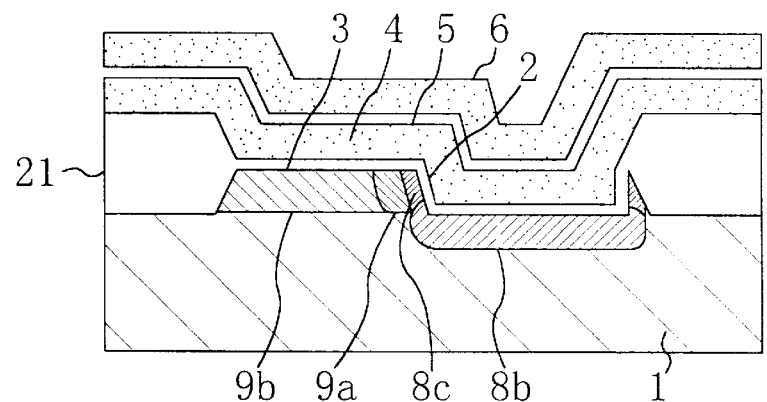
Figure 4C:
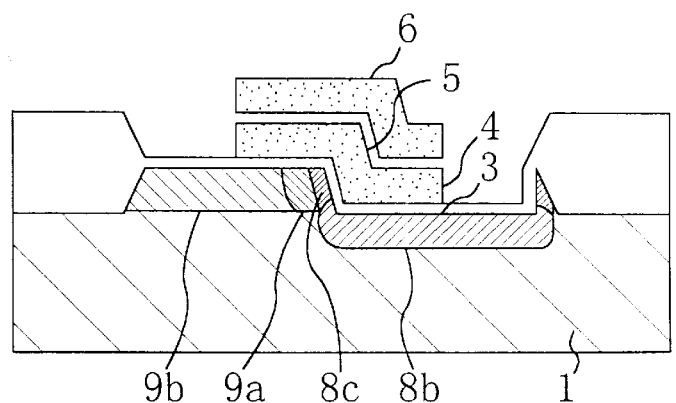

Next, as shown in FIG. 4B, after the resist mask 23 is removed, the first surface region 11, the step side region 13 and the second surface region 12 are thermally oxidized, thereby forming a tunnel oxide film 3 having a thickness of about 9 nm. In this case, by utilizing the crystallographic plane orientation dependence of the oxide film growth, the part of the tunnel oxide film 3 in the step side region 13 can be relatively thick as compared with the other parts. Next, by utilizing a CVD method or a thermal oxidization method, a floating gate 4 is formed of a poly-silicon film having a thickness of about 200 nm, a capacitive insulating film 5 is formed of an ONO film having a thickness of about 20 nm and a control gate 6 is formed of a poly-silicon film having a thickness of about 200 nm. Subsequently, by utilizing a known lithography technique and a known etching technique, the floating gate 4, the capacitive insulating film 5 and the control gate 6 are patterned, thereby forming the structure shown in FIG. 4C. It is noted that the control gate 6 may be formed as a word line connected to a plurality of nonvolatile memory cells. In such a case, after performing a process of isolating the respective floating gates 4 between the cells adjacent to each other in the direction of the word line, a conductive thin film (e.g., a poly-silicon thin film) to be the control gate 6 is deposited. When the conductive thin film is patterned into a word line shape, the floating gates 4 may be shaped as an isolated pattern.

Figure 5A:
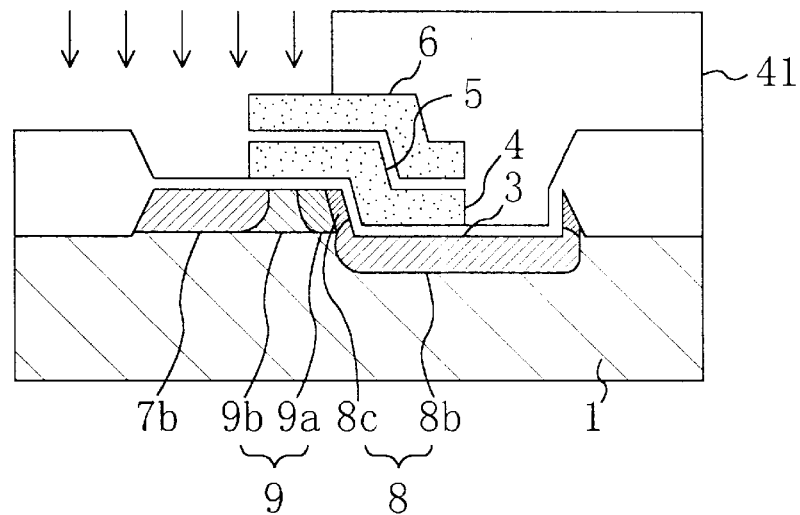
FIGS. 5A and 5B are cross-sectional views showing the respective process steps for fabricating the device shown in FIGS. 1A and 1B.
Figure 5B:
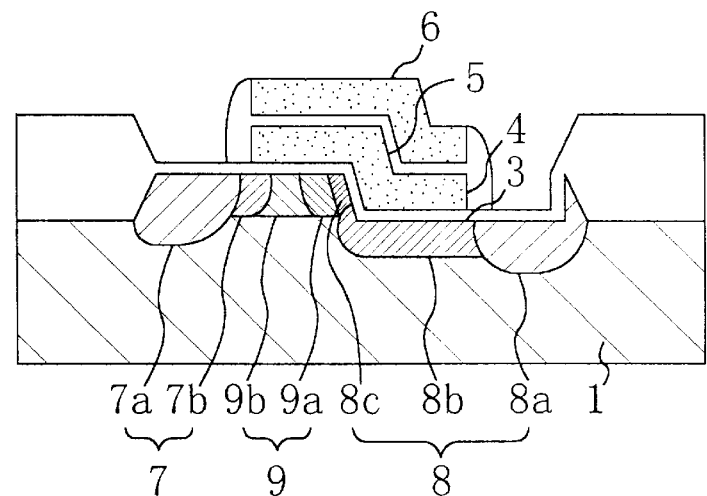

Next, as shown in FIG. 5A, after a resist mask 41 entirely covering the drain region 8 is formed, P ions are implanted into the second surface region 12 under the conditions where the dose is set at about $5.0 \times 10^{13}$ cm$^{-2}$ and the acceleration energy is set at about 40 keV, thereby forming an n layer including the low-concentration source region 7b. After the resist mask 41 is removed, insulating film side walls are formed on the sides of the floating gate 4 and the control gate 6 as shown in FIG. 5B. Then, by performing a high-concentration source/drain implantation process, the high-concentration impurity layers are simultaneously formed in the drain region and in the source region. It is noted that the insulating film side walls are not necessarily required to be formed.

Thereafter, known fabrication processes for forming inter-level insulating films and wires are performed, thereby completing the fabrication of the nonvolatile semiconductor memory device of this embodiment.

Figure 7:
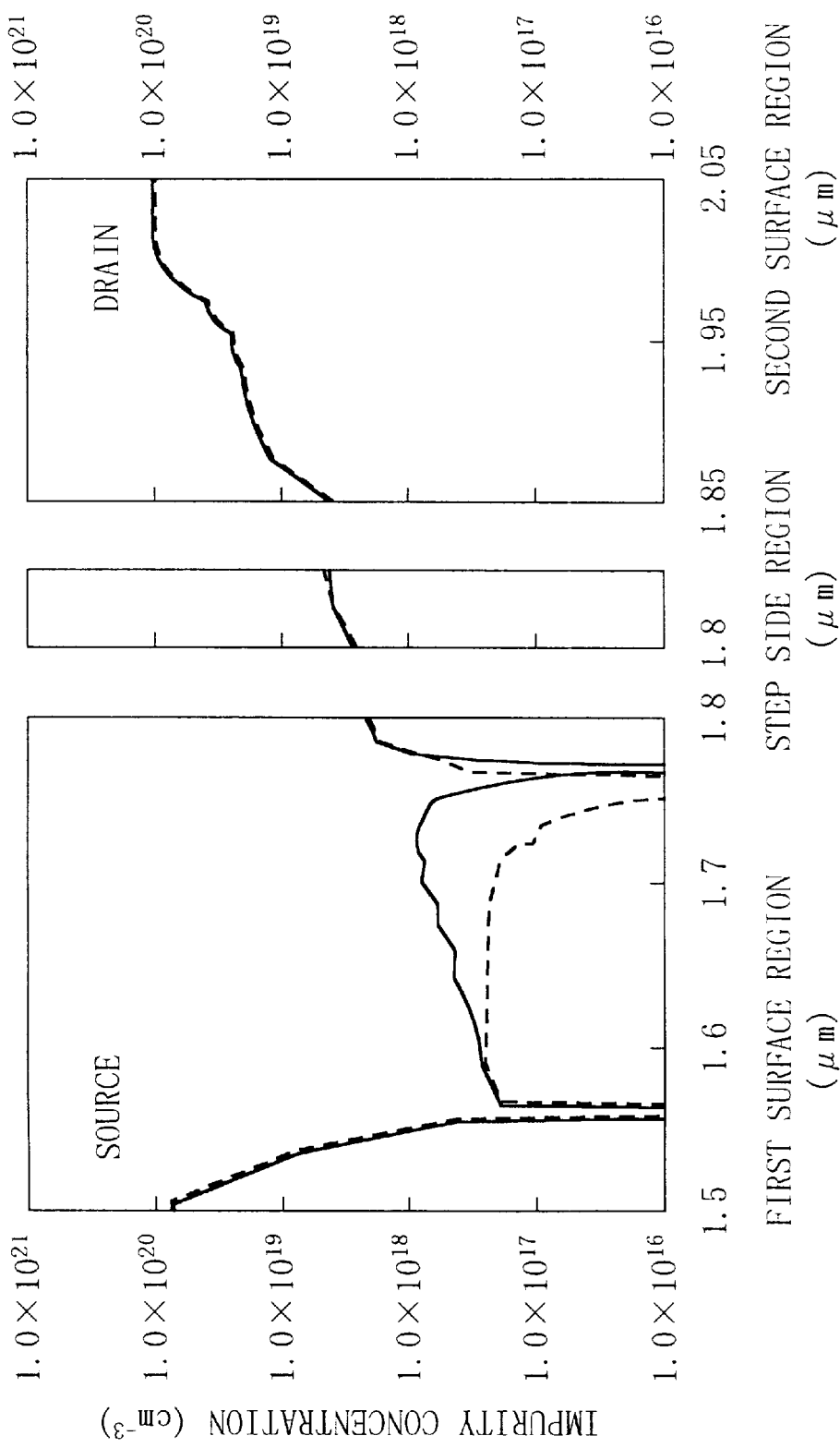
FIG. 7 is a graph showing the impurity concentration profiles obtained by a calculator simulation for the nonvolatile semiconductor memory device of the present invention.

In accordance with such a fabrication method, a drain region 8 having a desired impurity concentration profile can be formed by performing a simple process, and an asymmetric channel can be formed in the first surface region 11. These effects have been confirmed based on the calculation results obtained by performing a calculator simulation for calculating the one-dimensional impurity concentration distribution along the surface of the silicon substrate 1. FIG. 7 shows the impurity concentration distribution in the surface of the substrate 1 ranging over the first surface region 11, the step side region 13 and the second surface region 12. In FIG. 7, the impurity concentration in the surface of the substrate 1 is plotted with respect to the positions in the surface of the substrate over the area ranging from the source region 7 to the drain region 8. In FIG. 7, the solid line represents the impurity concentration for the case of forming an asymmetric channel region and the broken line represents the impurity concentration for the case of forming a symmetric channel region. The axis of ordinates represents the values of impurity concentration, and the axis of abscissas represents the distances along the surface which are defined by regarding a particular position in the first surface region 11 as a start point.

As can be understood from FIG. 7, an extremely-low-concentration impurity layer having an impurity concentration lower than $1 \times 10^{19}$ cm$^{-3}$ is formed in the step side region 13 including the corner portion between the first surface region 11 and the step side region 13. On the other hand, a low-concentration impurity layer 8b is formed in the second surface region 12 including the corner portion between the step side region 13 and the second surface region 12. Furthermore, a high-concentration impurity layer 8a in which the impurity concentration reaches $1 \times 10^{20}$ cm$^{-3}$ is formed on the right of the low-concentration impurity layer 8b.

According to the calculation results represented by the solid line, an asymmetric channel region 9a having a relatively high impurity concentration is formed in the region adjacent to the extremely-low-concentration impurity layer 8c, and the thickness of the extremely-low-concentration impurity layer 8c is only about 30 nm. In contrast, under the conditions for forming a symmetric channel region, the thickness of the extremely-low-concentration impurity layer 8c is about 50 nm.

The device characteristics of a nonvolatile semiconductor memory device having such a structure have not heretofore been studied sufficiently. Thus, the fundamental operation characteristics about the intensity of a drain electric field in a drain structure having a step will be first described based on the simulation results.

Figure 8:
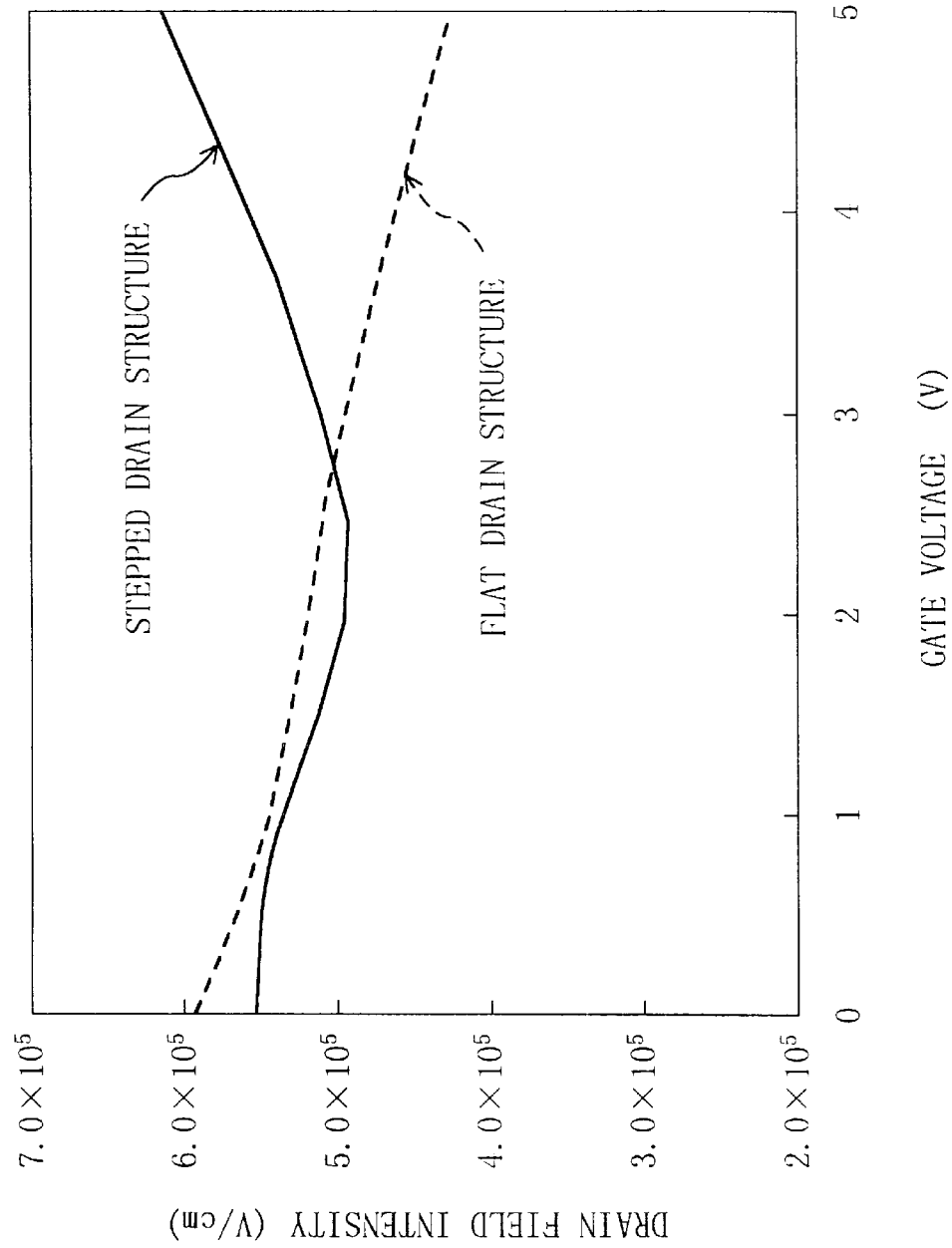
FIG. 8 is a graph showing the gate voltage dependence curves of the electric field intensity which have been obtained based on the calculator simulation for the nonvolatile semiconductor memory device of the present invention and for a conventional nonvolatile semiconductor memory device having a flat drain structure.

FIG. 8 shows the gate voltage dependence characteristics of the drain electric field intensity which have been obtained based on the calculator simulation for the drain structure of the nonvolatile semiconductor memory device of the present invention and for a conventional flat drain structure. In FIG. 8, the axis of ordinates represents intensities of electric field and the axis of abscissas represents gate voltages. The solid line represents the calculation result for the drain structure of the present invention and the broken line represents the calculation result for the conventional flat drain structure. As can be seen, when the drain structure is flat, the intensity of the drain electric field weakens as the gate voltage increases. On the other hand, in the drain structure of the present invention, even when the gate voltage is increased, the intensity of the drain electric field is hardly decreased. The floating gate 4 has a convex shape corresponding to the shape of the corner portion between the step side region 13 and the first surface region 11. Thus, it is considered that the drain electric field intensity is not decreased even by the increase of the gate voltage because the effect of the gate voltage weakening the drain electric field intensity is lightened by the correspondence in shape between the floating gate and the corner portion. When the gate voltage is set at a sufficiently high value, the surface potential in the step side region 13 functions to suppress the expansion of the drain depletion layer. As a result, the drain electric field intensity is rather increased. As can be understood, in the drain structure employed in the present invention, the gate voltage dependence of the drain electric field intensity is greatly different from a conventional one.

In accordance with this newly found fundamental operation characteristics, even when a voltage approximately as high as the drain voltage is applied the floating gate 4 in writing data, a high electric field can be formed at a drain voltage lower than a conventional one. In addition, the high electric field is formed in the vicinity of the step bottom corner. This is because the "effect of the floating gate weakening the drain electric field intensity", which is remarkable in a conventional structure, can be lightened by the characteristic shape of the floating gate of the present invention.

Figure 9:
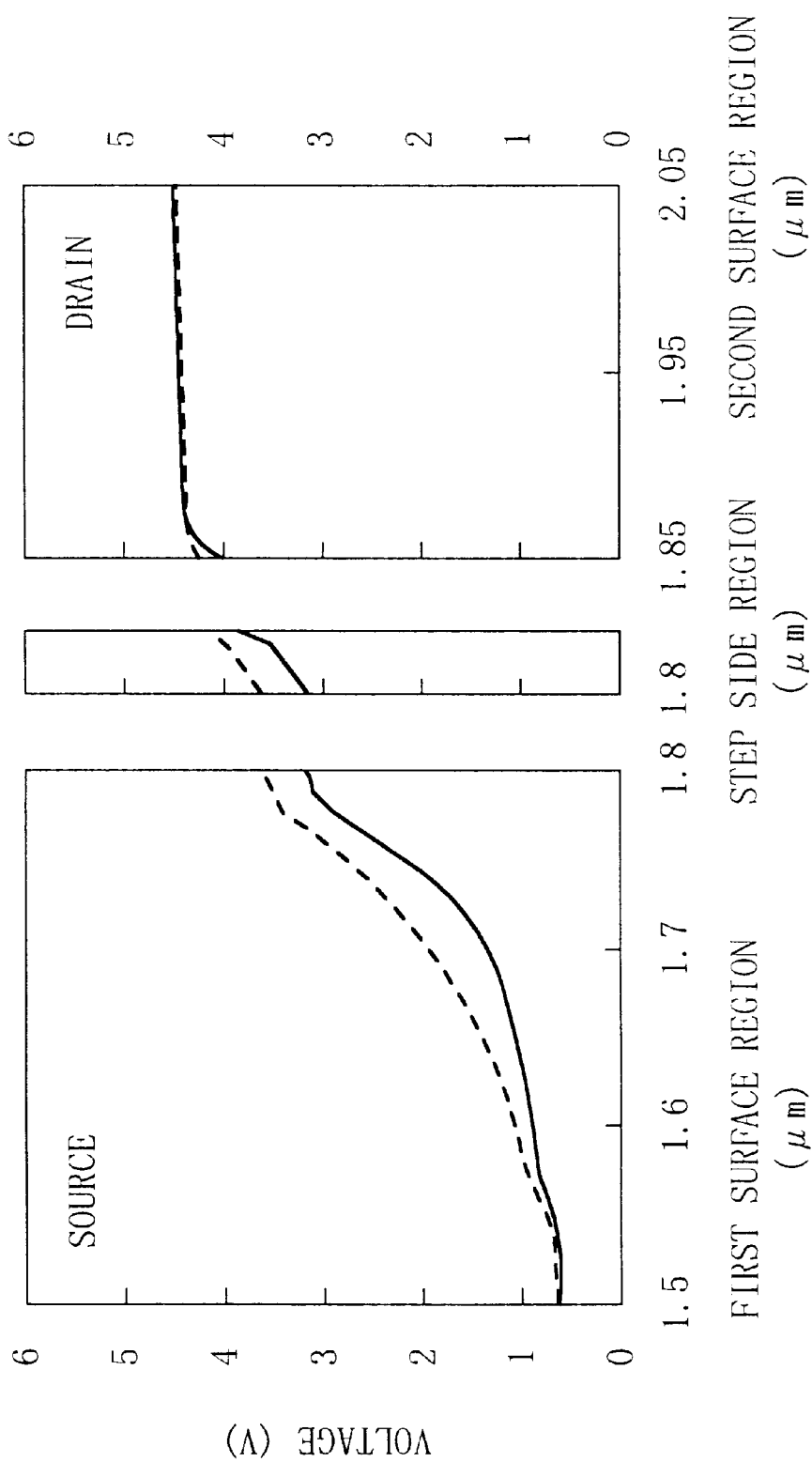
FIG. 9 is a graph showing potential profiles obtained based on a calculator simulation for the nonvolatile semiconductor memory device of the present invention.
Figure 10:
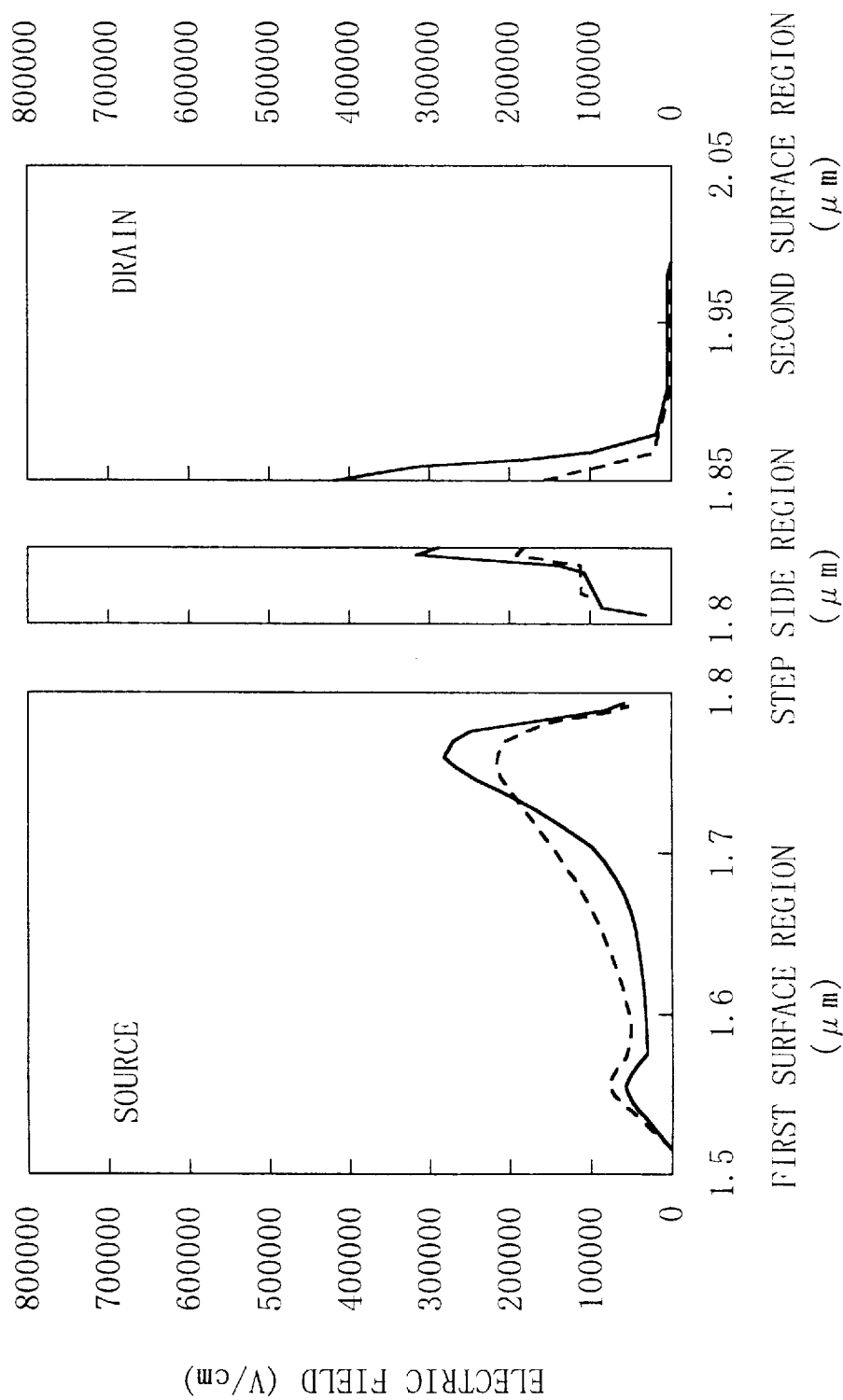
FIG. 10 is a graph showing electric field intensity profiles obtained based on a calculator simulation for the nonvolatile semiconductor memory device of the present invention.
Figure 11:
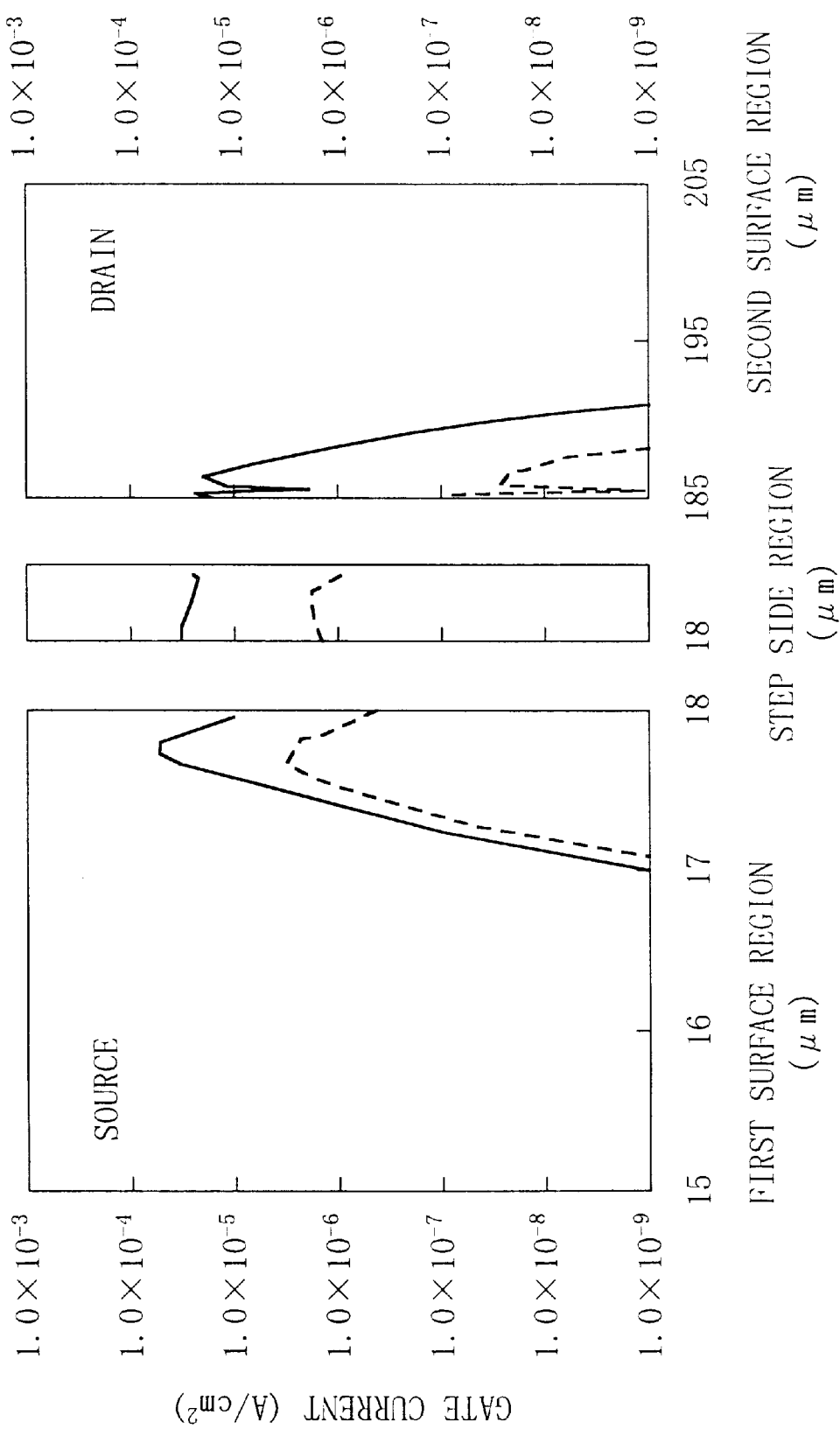
FIG. 11 is a graph showing gate current density profiles obtained based on a calculator simulation for the nonvolatile semiconductor memory device of the present invention.

FIGS. 9, 10 and 11 respectively show the potential distribution inside the device, the electric field distribution, and the distribution of gate current in the interface of the tunnel oxide film for the nonvolatile semiconductor memory device in this embodiment of the present invention. In all of FIGS. 9, 10 and 11, the calculation results obtained by applying a voltage of about 4 V to the drain region and a voltage of about 5 V to the floating gate are shown. The distribution of the impurity concentration in the source, drain and channel regions are as shown in FIG. 7. In each of these figures, the solid line represents a case of forming an asymmetric channel region and the broken line represents a case of forming a symmetric channel region.

When a voltage of about 4 V is applied to the drain region, the extremely-low-concentration drain region 8c is depleted and shows a potential lower than the applied voltage. Since the low-concentration drain region 8b has an impurity concentration higher than that of the extremely-low-concentration drain region 8c, a part of the low-concentration drain region 8b is depleted. As can be seen from FIG. 9, the potential is abruptly varied in the corner portion between the step side region 13 and the second surface region 12 (i.e., the step bottom corner). The potential of the high-concentration drain region 8a is held at a substantially constant value of about 4.55 V, which is the sum of the applied voltage of about 4 V and a half (0.55 V)

of the band gap of silicon. In the case of forming an asymmetric channel region, the potential in the extremely-low-concentration drain region 8c is high particularly in the upper part of the step side region 13 as compared with the case of forming a symmetric channel region. Moreover, the potential variation in the asymmetric channel region is more abrupt than that in the symmetric channel region.

As can be seen from FIG. 10, a peak of the electric field intensity exists at a position closer to the step side region 13 in the first surface region 11. In addition, a high electric field is separately formed in the corner portion between the step side region 13 and the second surface region 12. This is because the low-concentration drain region 8b has been depleted in this corner portion.

FIG. 11 shows the density distribution of gate current caused by the hot electrons generated under the electric field distribution shown in FIG. 10. As can be seen from FIG. 11, the density of the gate current becomes high not only in the corner portion between the step side region 13 and the second surface region 12, but also in the corner portion between the step side region 13 and the first surface region 11 and in the step side region 13. This shows that the electrons are injected into the floating gate with a high efficiency in the step side region 13 and in a part of the second surface region 12.

Figure 12:
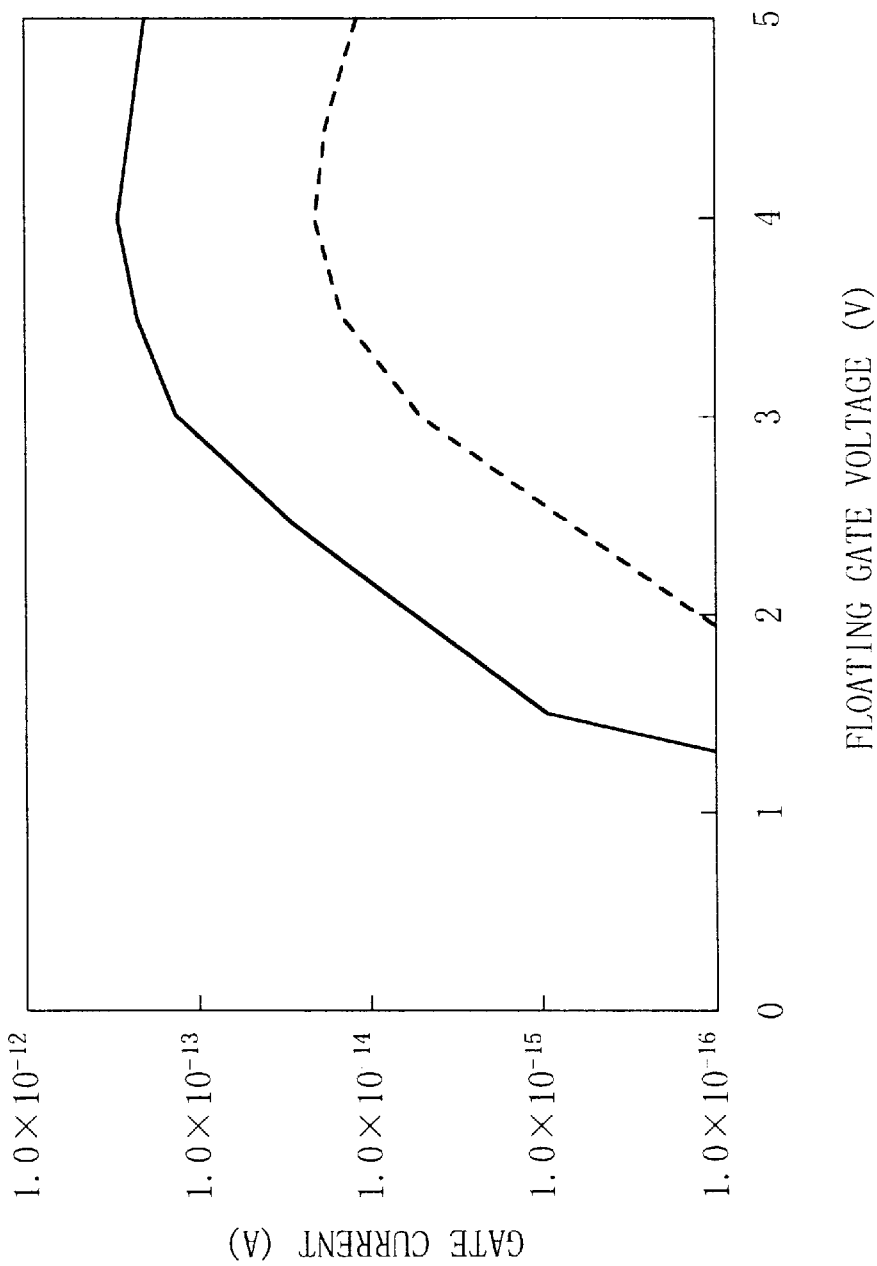
FIG. 12 is a graph showing the floating gate voltage dependence of the gate current obtained based on a calculator simulation for the nonvolatile semiconductor memory device of the present invention.

FIG. 12 shows the floating gate voltage dependence of the gate current for the nonvolatile semiconductor memory device of this embodiment. FIG. 12 shows the calculation results obtained by applying a voltage of about 4 V to the drain region. In FIG. 12, the solid line represents a case of forming an asymmetric channel region and the broken line represents a case of forming a symmetric channel region. The axis of ordinates represents gate current values and the axis of abscissas represents fixed voltages applied to the floating gate.

Even in the case of forming a symmetric channel region, a higher gate current value can be obtained as compared with a conventional structure. In the case of forming an asymmetric channel region, the characteristics have further been improved on the order of 10 times as compared with the case of forming a symmetric channel region.

Figure 13:
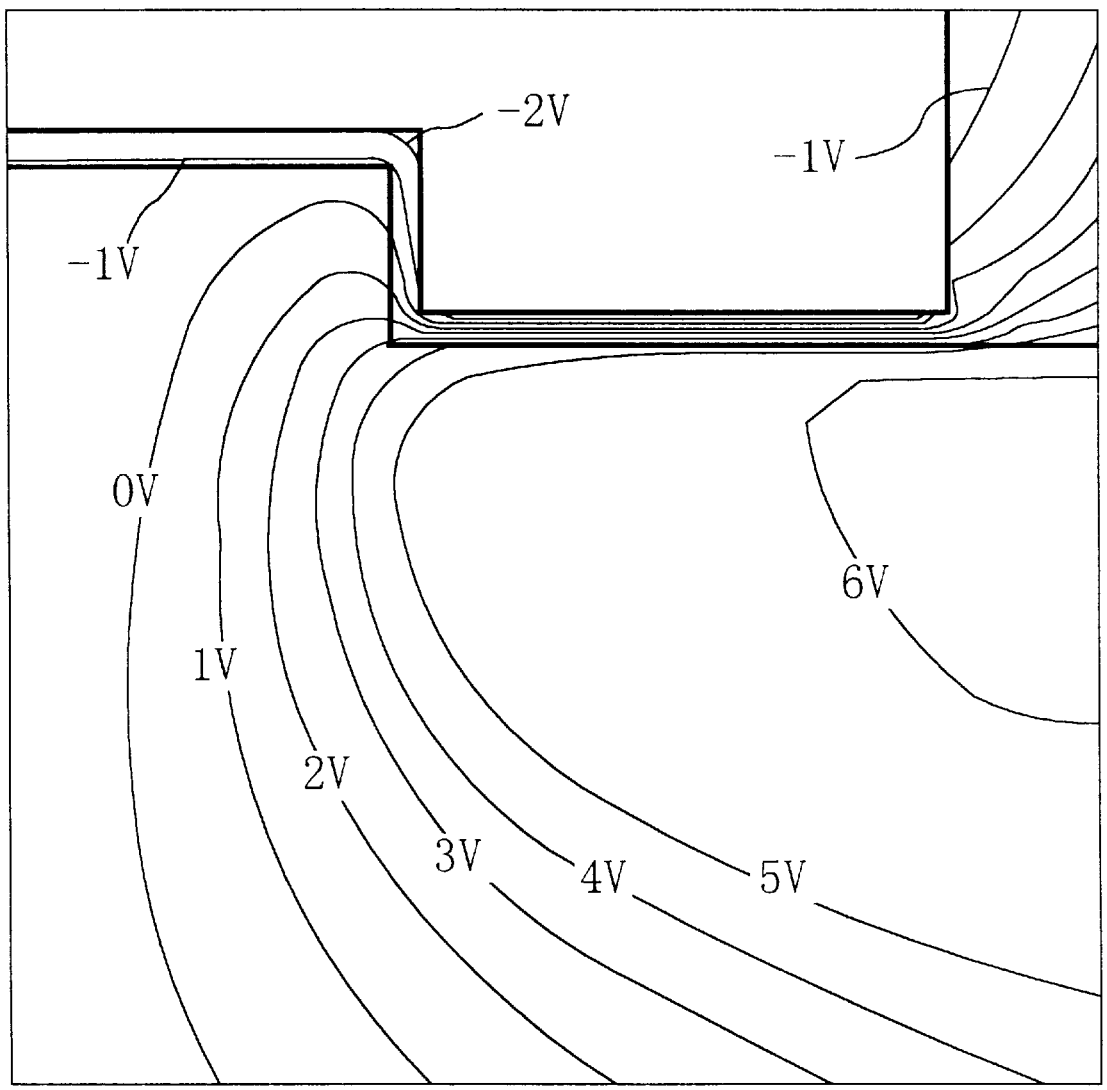
FIG. 13 is a contour line diagram showing a two-dimensional potential distribution obtained based on a calculator simulation in the vicinity of the drain in the case of erasing data for the nonvolatile semiconductor memory device of the present invention.

FIG. 13 is a contour line diagram showing a two-dimensional potential distribution In the vicinity of the drain when data is erased. In FIG. 13, the potential distribution when the voltage of the floating gate is set at about −2.6 V by applying a voltage of about −5 V to the control gate 6 and a voltage of about 5.5 V is applied to the drain region is calculated and shown. In this embodiment, the electrons are taken out from the floating gate into the drain region by utilizing the FN tunneling phenomenon in the tunnel oxide film. In a conventional structure, when data is erased, an abrupt band bend and a high electric field are generated in the vicinity of the surface and the holes generated by a band-to-band tunnel are injected into the oxide film. However, as can be seen from the two-dimensional potential distribution shown in FIG. 13, the formation of a high electric field has been suppressed and a band bend has been reduced in the step side region, which effect results from the formation of the extremely-low-concentration impurity layer 8c in the step side region 13. As a result, the erasure characteristics can be remarkably improved.

As described above, the structure of the present is invention can not only increase the electron injection efficiency in the step side region 13, but also cause the electrons to be injected into the corner portion between the step side region 13 and the second surface region 12 and into the vicinity thereof. As a result, the electron injection efficiency can be considerably increased as a whole. In addition, data erasure characteristics, as well as data write characteristics, can be improved.

Next, various fashions, in which the electrons are injected in the nonvolatile semiconductor memory device of the present invention, will be briefly described with reference to FIGS. 14A to 14D and FIGS. 15A and 15B.

Figure 14A:
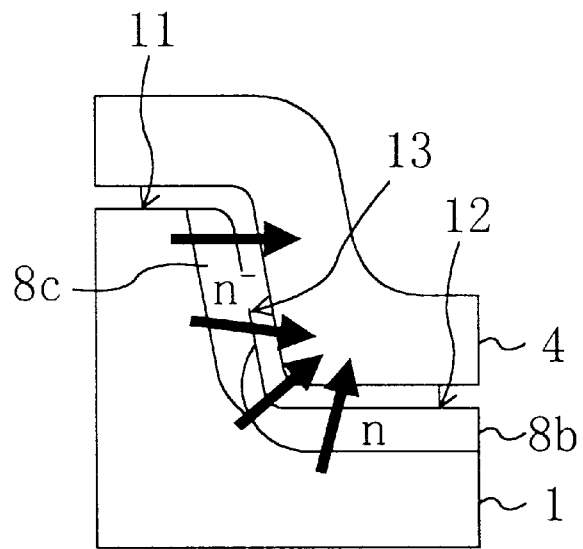
FIGS. 14A to 14D are schematic diagrams showing various fashions in which electrons are injected for the nonvolatile semiconductor memory device of the present invention.
Figure 14B:
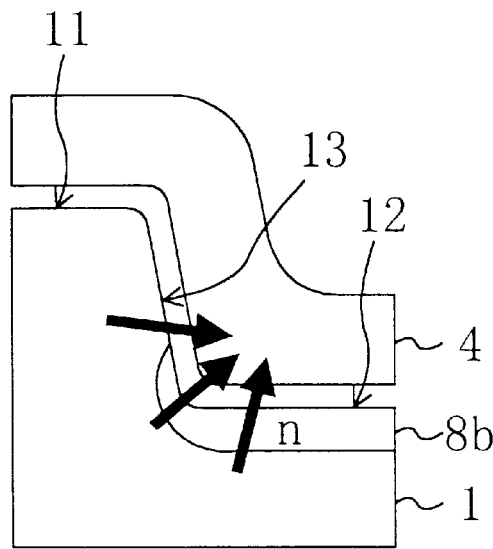
Figure 14C:
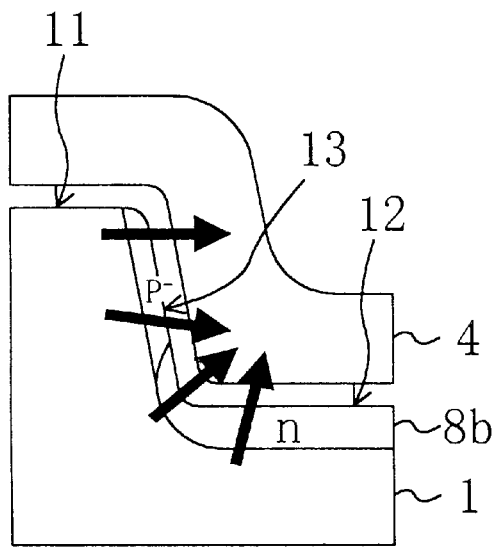

FIG. 14A corresponds to the embodiment shown in FIG. 1A. In this case, a considerable amount of electrons are injected into the floating gate 4 not only in the corner portion between the first surface region 11 and the step side region 13 but also in the corner portion between the step side region 13 and the second surface region 12. More exactly, the electrons are also injected in a part of the second surface region 12 which is closer to the step side region 13 and in the entire step side region 13. In FIG. 14A, the top end of the drain region reaches the first surface region 11. However, the top end of the drain region is not always required to reach the first surface region 11. So long as the low-concentration impurity layer 8b of the drain region is formed so as to cover the corner portion between the step side region 13 and the second surface region 12, as shown in FIG. 14b, a high electric field is generated in the vicinity of the corner portion. As a result, a remarkable amount of electrons are injected in the corner portion and the vicinity thereof. However, it is noted that a low-concentration impurity layer (p⁻ layer) may be provided in the step side region 13 such that the impurity concentration in a part of the channel region in the step side region 13 becomes lower than that of the other part of the channel region (FIG. 14C). The reasons thereof will be explained in more detail when the second embodiment is described.

Figure 14D:
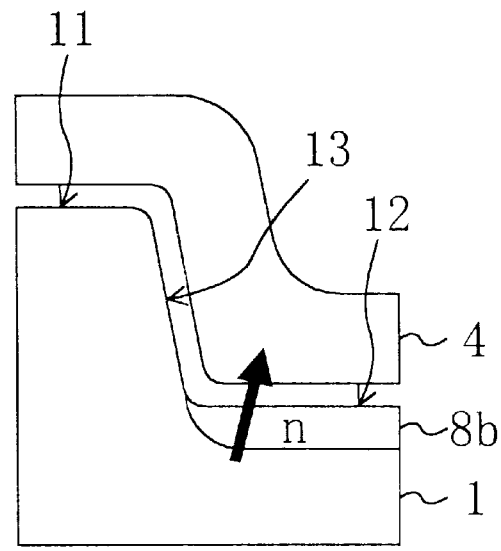

Furthermore, even when the low-concentration impurity layer 8b of the drain region does not entirely cover the corner portion between the step side region 13 and the second surface region 12 as shown in FIG. 14D, a high electric field is still generated in the vicinity of the corner portion so long as the low-concentration impurity layer extends to the vicinity of the corner portion. As a result, a remarkable amount of electrons are also injected in the corner portion and the vicinity thereof. In this case, it is also preferable to form a low-concentration impurity layer (p⁻ layer) in the step side region 13 such that the impurity concentration in a part of the channel region in the step side region 13 becomes lower than that in the other part of the channel region.

Figure 15A:
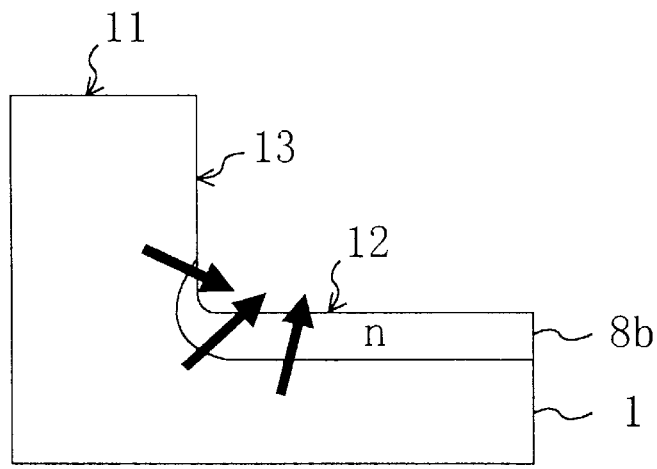
FIGS. 15A and 15B are schematic diagrams showing the relationships between the shape of the step and the electron injection.
Figure 15B:
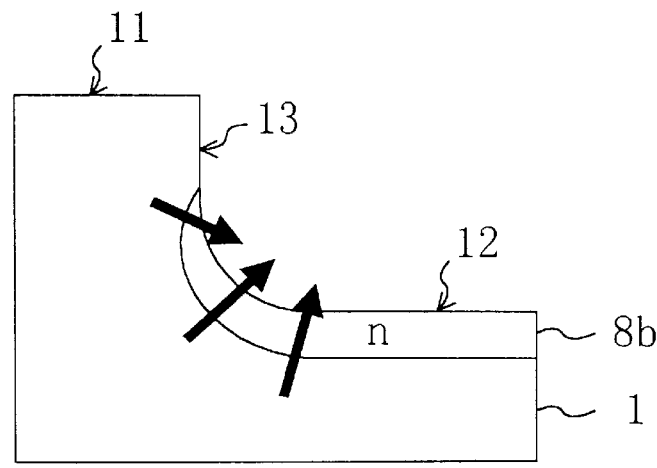

FIG. 15A shows a case where the corner portion between the step side region 13 and the second surface region 12 is a surface having a relatively small curvature, and FIG. 15B shows a case where the corner portion between the step side region 13 and the second surface region 12 is a surface having a relatively large curvature. In the case shown in FIG. 15B, since the floating gate is located exactly in the direction of the velocity vectors of the injected electrons, the electron injection can be performed with a higher efficiency than that of the case shown in FIG. 15A.

Embodiment 2

Figure 16:
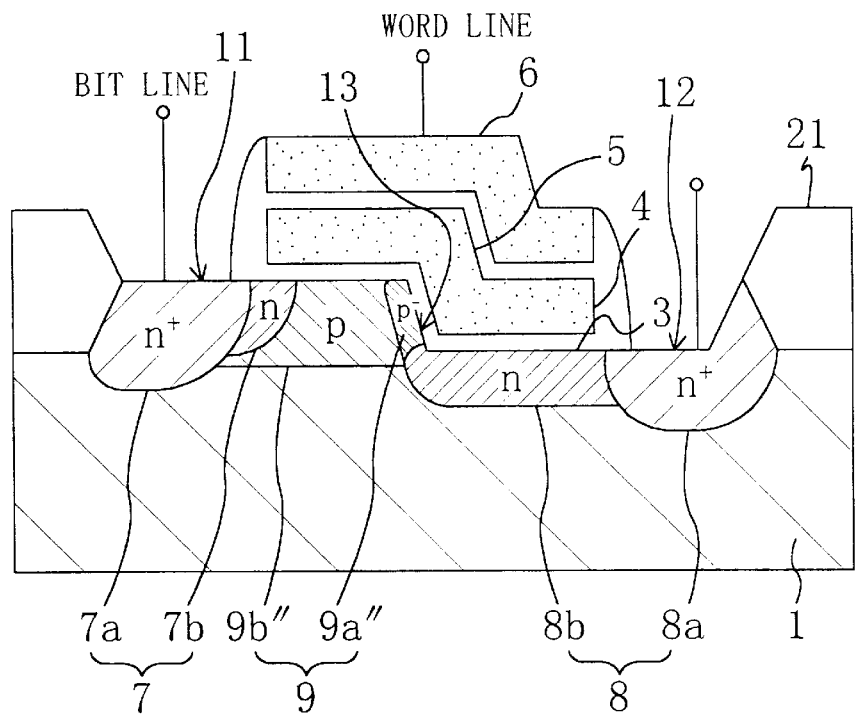
FIG. 16 is a cross-sectional view showing the second embodiment of the nonvolatile semiconductor memory device of the present invention.

FIG. 16 shows the cross section of the second embodiment of the nonvolatile semiconductor memory device according to the present invention. The device of this embodiment has the same structure as that of the device of the first embodiment, except for the structures of the channel region 9 and the drain region 8. Thus, the description of the common structures between the first and the second embodiments will be omitted herein and only the difference therebetween will be described.

The drain region 8 of this embodiment includes the high-concentration impurity layer 8a formed in the second surface region 12 and the low-concentration impurity layer 8b formed in the second surface region 12, but does not include the extremely-low-concentration impurity layer 8c. The top end of the low-concentration impurity layer 8b of the drain region 8 is formed so as to cover the corner portion between the second surface region 12 and the step side region 13, but does not reach the first surface region 11. Thus, though a part of the step side region 13 of this embodiment is in contact with the low-concentration impurity layer 8b of the drain region 8, the other part functions as a part of the channel region 9. Thus, the p-n junction formed between the drain region 8 and the channel region 9 is located in the vicinity of the corner portion between the second surface region 12 and the step side region 13.

The channel region 9 formed in the first surface region 11 includes a low-concentration impurity layer 9b" having a normal impurity concentration for channel region 9 and an extremely-low-concentration impurity layer 9a" having an impurity concentration lower than that of the low-concentration impurity layer 9b. The extremely-low-concentration impurity layer 9a" is provided between the low-concentration impurity layer 9b" and the step side region 13 and faces the floating gate 4 via the tunnel oxide film 3.

The nonvolatile semiconductor memory device of this embodiment is characterized in that the extremely-low-concentration impurity layer 9a" of the channel region 9 is formed in the step side region 13 and covers the step side region 13. The nonvolatile semiconductor memory device of this embodiment is also characterized in that the low-concentration drain region 8b is formed so as to cover the corner portion between the second surface region 12 and the step side region 13.

In the same way as in the first embodiment, the fundamental operational characteristics about the gate voltage dependence of the drain electric field intensity in the drain structure having a step are exhibited. In addition, since the p-n junction is formed in the vicinity of the step bottom corner, the drain electric field intensity in the step bottom corner is larger than that of the first embodiment. Furthermore, since the conductivity type of the extremely-low-concentration impurity layer 9a" formed in the step side region 13 is p-type, there is no possibility that the generated hot electrons are scattered by the electrons in the thermal equilibrium state in the step side region 13. As a result, the hot electrons can be injected from the step side region 13 into the floating gate 4 with a higher efficiency.

In this embodiment, though the low-concentration drain region 8b covers the corner portion between the second surface region 12 and the step side region 13, the top end of the drain region 8 does not reach the first surface region 11. The extremely-low-concentration impurity layer 9a" of the channel region 9 exists between the top end of the drain region 8 and the first surface region 11. Thus, even when a drain voltage is applied to the drain region 8, the potential in the step side region 13 cannot but be dropped as compared with the potential in the low-concentration impurity layer 8b of the drain region 8. However, since the impurity concentration of the channel region 9 has become relatively low in the step side region 13, the potential in the channel region 9 does not extremely drop even in the step side region 13, as compared with the potential in the drain region 8. In other words, a "drain voltage extension region", which has extended from the drain region 8, is formed in the channel region 9. In order to obtain a high intra-channel potential in the corner portion between the first surface region 11 and the step side region 13, it is effective to make the impurity concentration in the channel region 9 relatively low in the step side region 13 and it is also effective to make the low-concentration drain region 8b cover the corner portion between the second source region 12 and the step side region 13.

As compared with the first embodiment in which the drain region 8 reaches the first surface region 11 along the step side region 13, the electric field intensity in the step side region 13 of the nonvolatile semiconductor memory device of this embodiment becomes lower. However, by lowering the impurity concentration of the channel region in the step side region 13 as described above, the electron injection efficiency is not extremely decreased in the step side region 13. Conversely, the electron injection efficiency in the corner portion between the step side region 13 and the second surface region 12 is considerably increased in this embodiment, as compared with a conventional example.

In this embodiment, the corner portion between the second surface region 12 and the step side region 13 is completely covered with the low-concentration drain region 8b. Alternatively, the low-concentration drain region 8b may not completely cover the corner portion. For example, even when the top end of the low-concentration drain region 8b is formed so as to reach the vicinity of the corner portion, a higher electron injection efficiency is realized as compared with a conventional nonvolatile semiconductor memory device. This is because a high electric field is formed in the corner portion.

Embodiment 3

Figure 17:
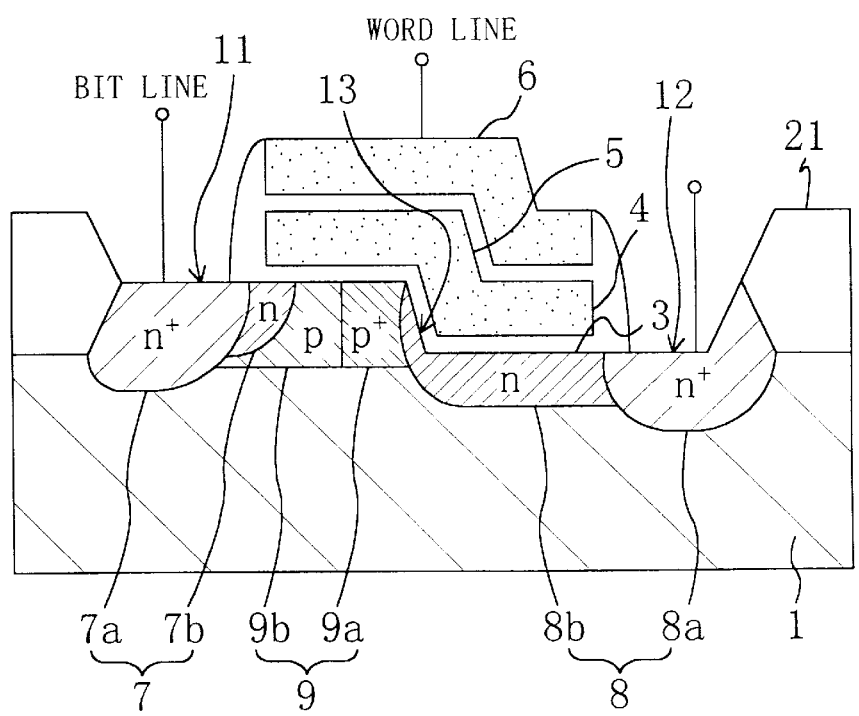
FIG. 17 is a cross-sectional view showing the third embodiment of the nonvolatile semiconductor memory device of the present invention.

FIG. 17 shows the cross section of the third embodiment of the nonvolatile semiconductor memory device according to the present invention. The device of this embodiment has the same structure as that of the device of the first embodiment, except for the structures. of the channel region 9 and the drain region 8. Thus, the description of the common structures between the first and the third embodiments will be omitted herein and only the difference therebetween will be described.

The drain region 8 of this embodiment includes the high-concentration drain region 8a formed in the second surface region 12 and the low-concentration drain region 8b formed in the second surface region 12 and in the step side region 13. The top end of the low-concentration drain region 8b reaches the first surface region 11. The channel region 9 formed in the first surface region 11 includes the low-concentration impurity layer 9b and the high-concentration impurity layer 9a having an impurity concentration higher than that of the low-concentration impurity layer 9b. The high-concentration impurity layer 9a of the channel region 9 is in contact with the top end of the low-concentration drain region 8b. If the impurity concentration in a part of the drain region 8 which has been formed along the step side region 13 and the second surface region 12 is uniformly decreased, then a circuit configuration in which electrons are taken out into the drain region 8 can be formed by utilizing the FN tunneling phenomenon. However, since a large voltage drop is caused in the part of the drain region 8 with a reduced impurity concentration, the drain potential in the corner portion between the first surface region 11 and the step side region 13 also drops. As a result, the intensity of the horizontal electric field between the drain region 8 and the channel region 9 is decreased, and the electron injection efficiency in the step side region 13 is decreased. In this embodiment, by providing an asymmetric channel region, the decrease in electron injection efficiency in the step side region 13 can be suppressed.

Figure 18A:
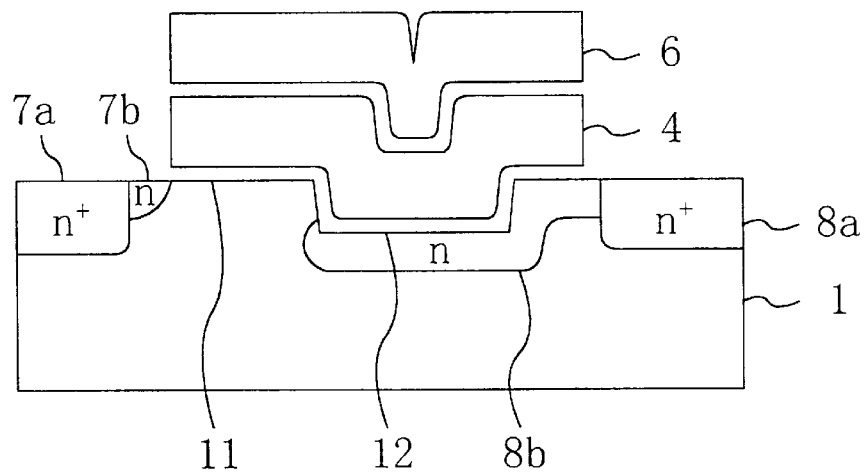
FIGS. 18A and 18B are cross-sectional view s showing other modified embodiments of the nonvolatile semiconductor memory device of the present invention.
Figure 18B:
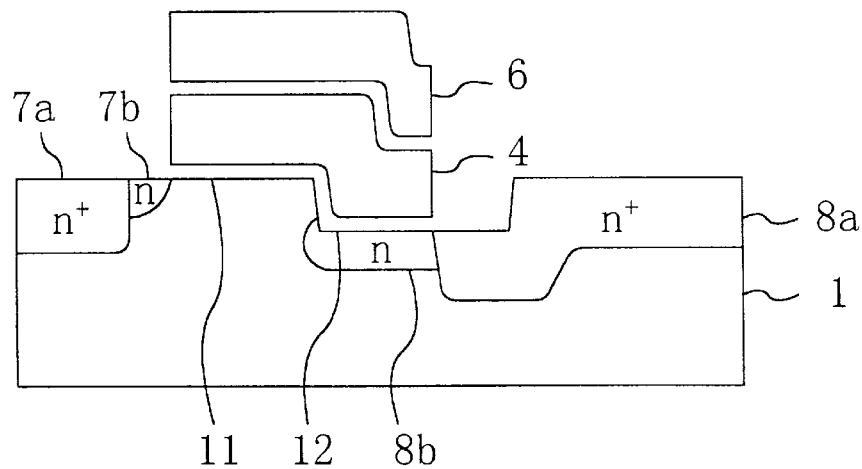

In the foregoing embodiments, the majority of the concave portion formed in the active region 10 is occupied by the drain region 8, in which only the second surface region 12 having a level lower than that of the first surface region 11 is formed. However, as shown in FIGS. 18A and 18B, a surface region having the same level as that of the first surface region 11 (i.e., a third surface region) may be formed in the drain region 8. In the structure shown in FIG. 18A, the floating gate 4 and the control gate 6 entirely cover the concave portion, and the high-concentration impurity layer 8a of the drain region 8 is formed outside of the concave portion (in the third surface region). In the structure shown in FIG. 18B, the high-concentration impurity layer 8a of the drain region 8 is formed so as to extend from the inside of the concave portion to the outside of the concave portion (to the third surface region). In order to form such structures as those shown in FIGS. 18A and 18B, it is necessary to form a concave portion in the semiconductor substrate 1 by using a mask having an opening located closer to the center of the active region 10 as compared with the opening 24 shown in FIGS. 3B and 3C.

Figure 19A:
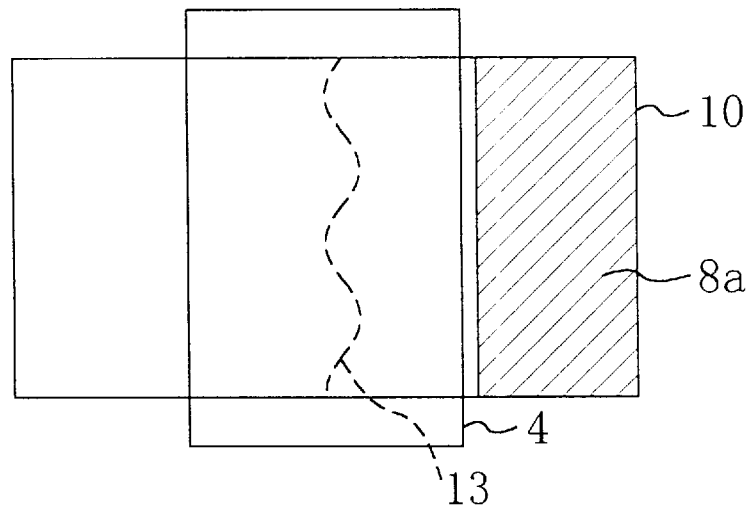
FIGS. 19A and 19B are plan views showing still other modified embodiments of the nonvolatile semiconductor memory device of the present invention.
Figure 19B:
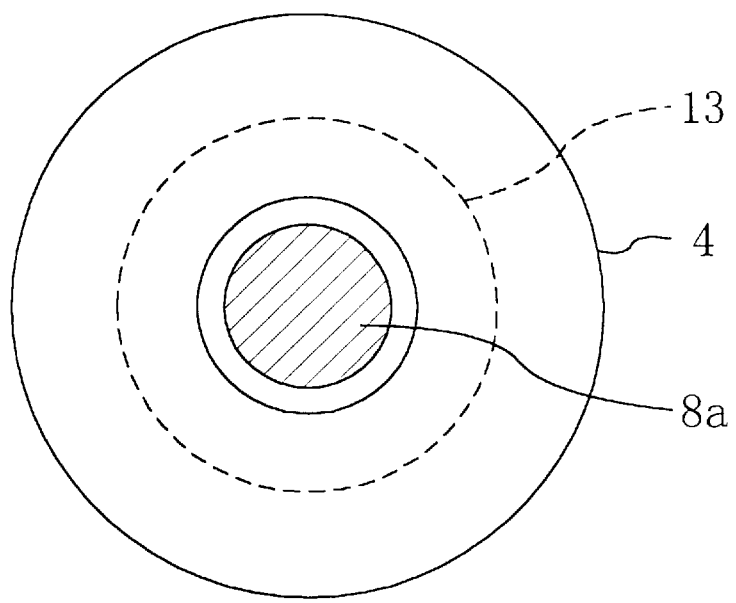

It is noted that the step side region 13 is not always required to have a linear planar shape, but may have a winding shape as shown in FIG. 19A. Alternatively, as shown in FIG. 19B, the step side region 13 may be formed so as to surround a circular drain region (high-concentration impurity layer 8a) and a ring-shaped floating gate 4 may be formed. In such a case, since the drain region 8 of each cell is isolated from the source region via the ring-shaped channel region, a single source region may be shared among a plurality of nonvolatile memory cells, and it is no longer necessary to provide an element isolation layer for the plurality of nonvolatile memory cells sharing the single source region.

Figure 20:
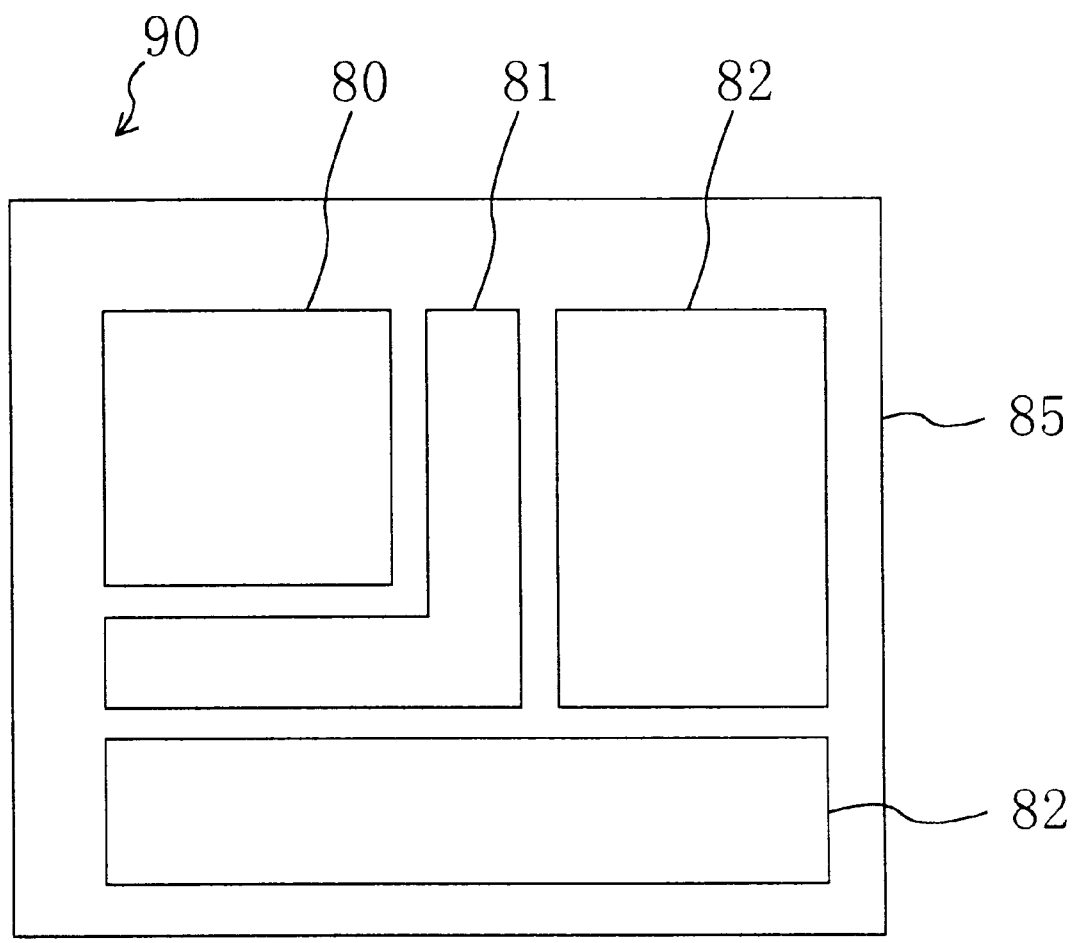
FIG. 20 is a block diagram showing a configuration of the semiconductor integrated circuit of the present invention.
Figure 21:
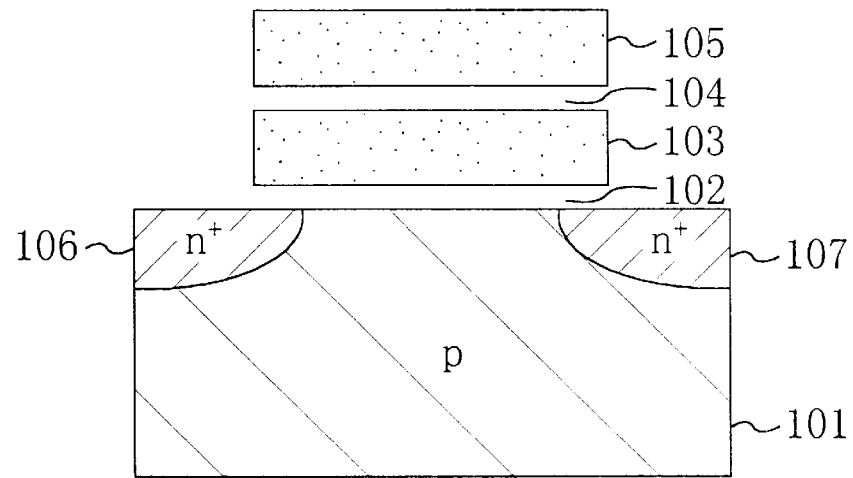
FIG. 21 is a cross-sectional view showing an exemplary conventional nonvolatile semiconductor memory device.
Figure 22:
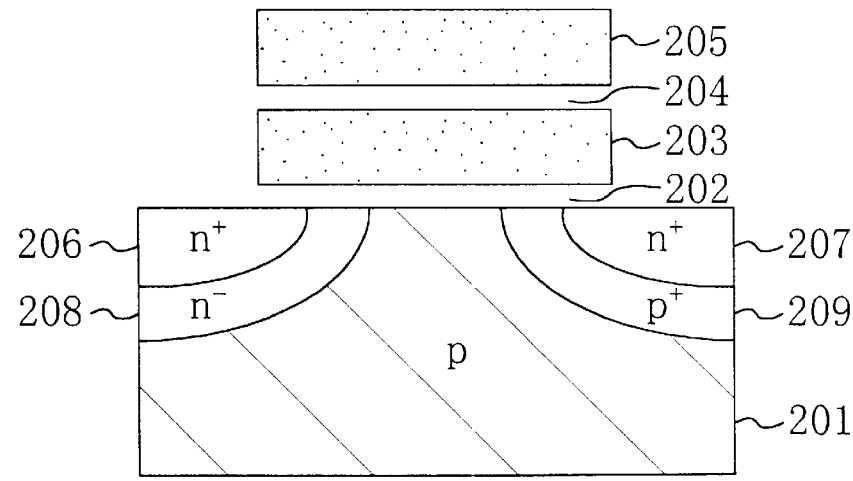
FIG. 22 is a cross-sectional view showing another exemplary conventional nonvolatile semi-conductor memory device.
Figure 23:
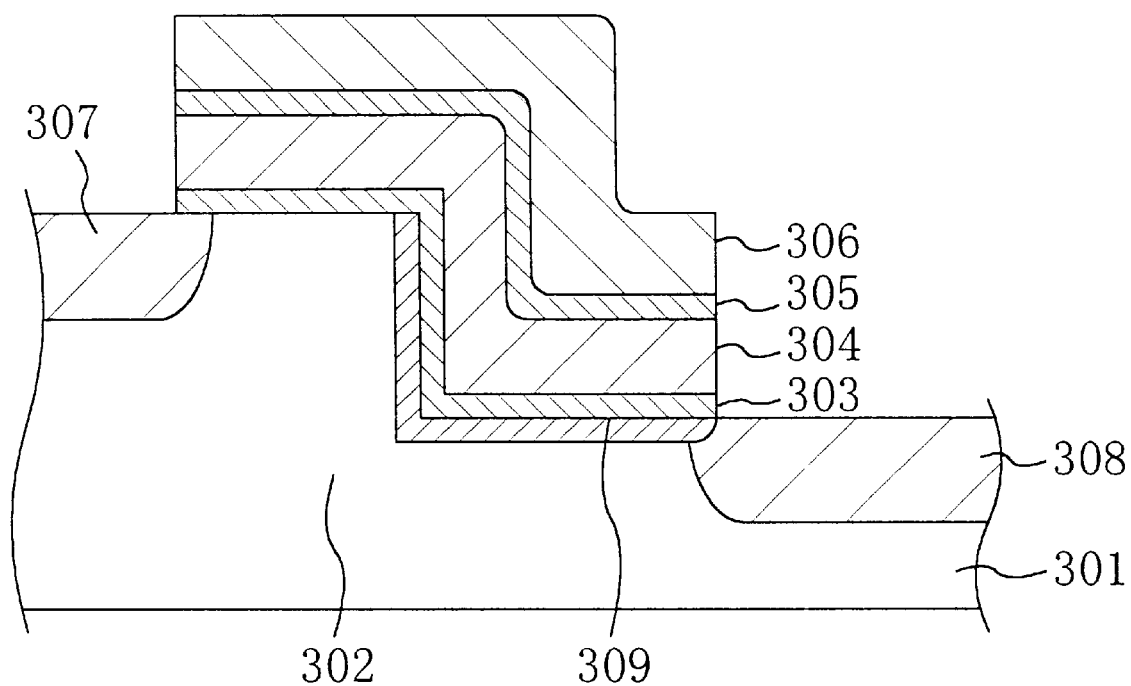
FIG. 23 is a cross-sectional view showing still another exemplary conventional nonvolatile semi-conductor memory device.
Figure 24A:
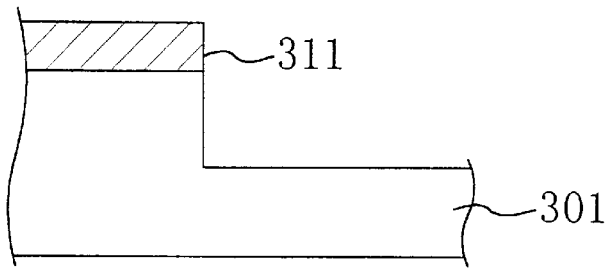
FIGS. 24A to 24E are cross-sectional views showing respective process steps for fabricating the device shown in FIG. 22.
Figure 24B:
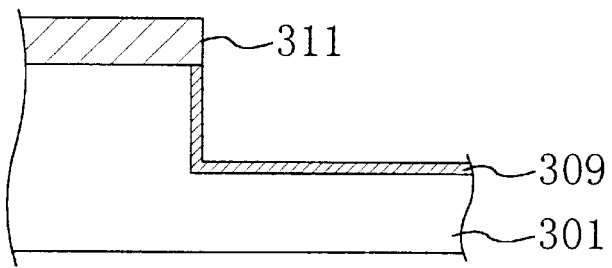
Figure 24C:
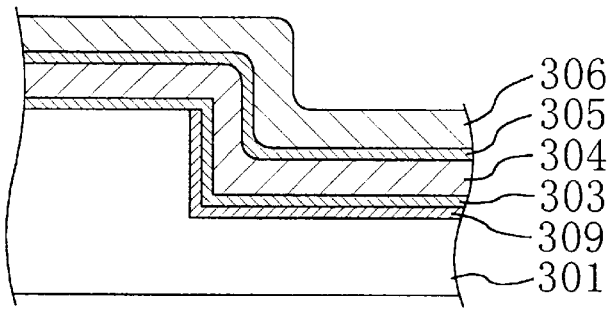
Figure 24D:
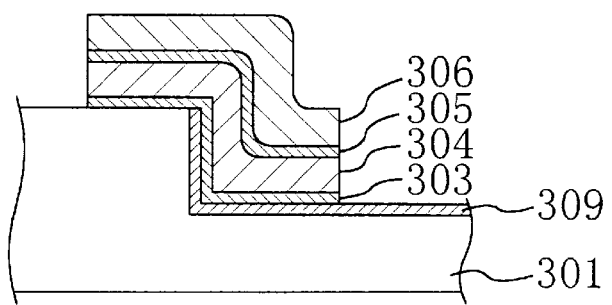
Figure 24E:
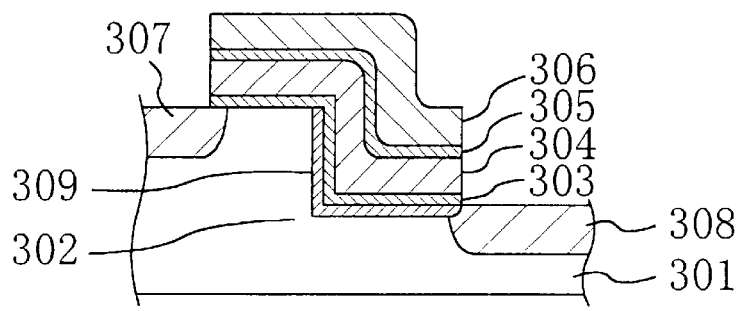

In the foregoing description, the present invention has been described as being applied to a nonvolatile semiconductor memory device. Hereinafter, an embodiment of the semiconductor integrated circuit of the present invention will be described with reference to FIG. 20.

The semiconductor integrated circuit 90 of this embodiment is a digital signal processor (DSP). The semiconductor integrated circuit 90 includes: a memory cell array section 80 including the nonvolatile semiconductor memory devices as nonvolatile memory cells in at least a part thereof; a peripheral circuit section 81 for driving the memory cell array section 80; and a processing circuit section 82 for performing digital signal processing on a common semiconductor chip 85. In the memory cell array section 80, a large number of nonvolatile memory cells are arranged in columns and rows. Each of the memory cells may have the configuration shown in FIGS. 1A and 1B or any arbitrary configuration described in the other embodiments. Programs or data are stored in the memory array section 80. In accordance with the contents to be stored therein, at least one memory block including memory cells other than the nonvolatile memory cells may also be provided. The processing circuit section 82 is further divided into a plurality of function blocks (not shown). Since these blocks are composed of known processing circuit components such as control sections, arithmetic sections, multiplication sections, registers and the like, the detailed description thereof will be omitted herein. These components may be appropriately designed and arranged by those skilled in the art.

Since such a DSP includes the nonvolatile memories of the present invention in at least a part of the memory cell array section and the nonvolatile memory cells can perform the write of data at a high speed, it is possible to realize satisfactorily high speed processing required for a DSP. In addition, according to the present invention, the power supply voltage required for operating the nonvolatile memories can be reduced while maintaining the write speed into the nonvolatile memories at a practical level. As a result, a single power supply can be commonly used for the processing circuit section and the nonvolatile memory cell array section, which would be impossible unless the nonvolatile semiconductor memory device of the present invention, which can write data at a high speed upon the application of a low voltage, is used.

It is noted that the semiconductor integrated circuit of the present invention is not limited to a DSP, but is widely applicable to various kinds of memory-incorporated VLSI's.

The nonvolatile semiconductor memory device of the present invention uses a semiconductor substrate having surface including a first surface region at a first level, a second surface region at a second level lower than the first level, and a step side region linking the first surface region and the second surface region together. The drain region includes a low-concentration impurity layer which is formed in the second surface region and which has one end extending toward the step side region. The floating gate covers the step side region and at least a part of the low-concentration impurity layer via the first insulating film. Thus, since a high electric field is formed in the corner portion between the step side region and the second surface region, the electrons can be injected into the floating gate with a considerably increased efficiency. As a result, a data write speed can be increased and a power supply voltage required for operating the device can be reduced.

If the low-concentration impurity layer of the drain region covers a corner portion between the second surface region and the step side region, then the electron injection efficiency in the corner portion and in the vicinity thereof is further increased.

If the drain region further include an extremely-low-concentration impurity layer having an impurity concentration lower than the impurity concentration of the low-concentration impurity layer and the extremely-low-concentration impurity layer is formed in the step side region, then a high electric field is generated even in the upper part of the step side region. As a result, the electrons can be injected into the floating gate with a further increased efficiency. Particularly if the impurity concentration in a part of the channel region adjacent to the extremely-low-concentration impurity layer is higher than the impurity concentration in a part of the channel region adjacent to the source region (i.e., if an asymmetric channel is formed), the intensity of the electric field formed between the extremely-low-concentration impurity layer and the channel region is further enhanced. In addition, since the thickness of the extremely-low-concentration impurity layer is substantially reduced owing to the impurity in the channel region, the scattering of the electrons can be reduced in the extremely-low-concentration impurity layer and the electron injection efficiency can be further increased.

If the channel region expands from the first surface region toward the corner portion between the second surface region and the step side region along the step side region, then the junction formed between the drain region and the channel region becomes closer to the corner portion between the second source region and the step side region. As a result, the intensity of the electric field formed in the corner portion is further enhanced and the electrons can be injected from the corner portion and the vicinity thereof into the floating gate with an increased efficiency. In such a case, if the impurity concentration in a part of the channel region adjacent to the step side region is lower than the impurity concentration in a part of the channel region adjacent to the source region, then the decrease in potential can be lightened in the region from the drain region to the upper part of the step side region, thereby advantageously accelerating the electrons.

If the low-concentration impurity layer of the drain region substantially reaches the first surface region along the step side region, then the drain potential is not decreased even in the upper part of the step side region, i.e., the corner portion between the first surface region and the step side region, so that a high electric field is formed in the junction region between the drain region and the channel region. As a result, the electrons can be injected from the step side region with an increased efficiency. In such a case, if the Impurity concentration in a part of the channel region adjacent to the step side region is set to be higher than the impurity concentration in a part of the channel region adjacent to the source region, then the intensity of the electric field formed between the low-concentration impurity layer and the channel region is further enhanced. In addition, since the thickness of the low-concentration impurity layer is substantially reduced owing to the impurity in the channel region, the scattering of the electrons can be reduced in the low-concentration impurity layer and the electron injection efficiency can be further increased.

If the corner portion between the second surface region and the step side region is a surface having a curvature, a larger percentage of the injected electrons are suitably accumulated in the floating gate, because the convex portion of the floating gate is located in front of the direction of the velocity vectors of the electrons (i.e., the implantation direction).

If the thickness of the first insulating film over the step side region is larger than the thickness of the first insulating film over the other regions, then the effect of the floating gate weakening the drain electric field intensity is suppressed. As a result, the intensity of the electric field formed in the corner portion between the second surface region and the step side region and in the vicinity thereof is not decreased by the potential of the floating gate.

The method for fabricating a nonvolatile semiconductor memory device of the present invention includes the steps of: doping an active region of a surface of a semiconductor substrate, including a portion to be a source region, a portion to be a channel region and a portion to be a drain region, with an impurity for the channel region; covering the surface of the semiconductor substrate with a mask having an opening through which at least a part of the portion to be the drain region is exposed; etching a part of the active region through the opening of the mask, thereby forming a concave portion in the active region; and doping an impurity for the drain region into the concave portion in the active region through the opening of the mask, thereby forming a low-concentration impurity layer, functioning as a part of the drain region, under a bottom of the concave portion. Thus, the low-concentration impurity layer of the drain region can be formed easily. As a result, a high electric field can be formed in the corner portion between the step side region and the second source region and in the vicinity thereof, and a drain region, for considerably improving the efficiency with which the electrons are injected into the floating gate, can be provided. As a result, a nonvolatile semiconductor memory device, which can increase a data write speed and reduce a power supply voltage required for operating the device, can be provided.

If the method further includes a step of doping an impurity of the same conductivity type as that of the impurity for the drain region into the concave portion through the opening of the mask, thereby forming an extremely-low-concentration impurity layer, functioning as a part of the drain region, in the side of the concave portion, prior to the step of forming the low-concentration impurity layer under the bottom of the concave portion, then the extremely-low-concentration impurity layer can be formed in an appropriately region by effectively using in common the mask for forming the concave portion in the substrate.

The same effects can also be attained if the extremely-low-concentration impurity layer is formed in the side of the concave portion after the low-concentration impurity layer has been formed under the bottom of the concave portion.

If the method further includes a step of doping an impurity of the same conductivity type as that of the impurity for the channel region into a part of the active region through the opening of the mask, thereby partially increasing the impurity concentration of the portion to be the channel region, prior to the step of forming the concave portion in the active region, then an asymmetric channel useful for increasing the electron injection efficiency can be formed by effectively using in common the mask for forming the concave portion in the substrate.

If the step of forming the concave portion in the active region is performed by a chemical dry etching process, effects can be attained in that the step side region and the second source region are not damaged and that the quality of the insulating film (i.e., the tunnel oxide film) formed thereon can be improved.

As is apparent from the foregoing description, the nonvolatile semiconductor memory device of the present invention realizes an efficient electron injection not only in the side of the step, but also in the corner portion at the bottom of the step. In addition, by providing an asymmetric channel region, the electron injection efficiency can be improved in the step side region. Moreover, a circuit configuration for erasing data by taking out the electrons from the floating gate into the drain region is enabled. Furthermore, even when a high bias is applied to the drain layer and a negative bias is applied to the floating gate in erasing data, it is still possible to suppress the injection of holes into the oxide film, so that the erasure characteristics can be improved.

Furthermore, in a circuit configuration in which a source bias and a drain bias are exchanged for suppressing the degradation of a read disturb margin in reading data, the read current can be increased by forming an asymmetric channel in which the impurity concentration is high in the side of the low-concentration drain region and the impurity concentration is low in the side of the source region.

Therefore, the present invention provides technologies indispensable for realizing a nonvolatile semiconductor memory device which can perform a high-efficiency electron injection at a low voltage, can perform read and write operations at a high speed, and can suppress the degradation of retention time when data is erased and read out. In view of these numerous effects, the industrial value of the present invention is extremely high.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device comprising:

a substrate having a surface including a first surface region at a first level, a second surface region at a second level lower than the first level, and a step side region linking the first and second surface regions together;

a channel region formed in the first surface region of the substrate;

source and drain regions formed to interpose the channel region therebetween;

a first insulating film formed on the surface of the substrate; and a floating gate formed on the first insulating film, wherein the drain region includes a low-concentration impurity layer which is formed in the second surface region and which has one end extending toward the step side region, and a high-concentration impurity layer which is connected to the low-concentration impurity layer and which is formed in a region distant from the channel region, an impurity concentration of the low-concentration impurity layer being lower than that of the high-concentration impurity layer, and wherein the low-concentration impurity layer covers a corner portion between the second surface region and the step side region, but does not reach the first surface region, and wherein the floating gate covers the step side region and at least a part of the low-concentration impurity layer via the first insulating film.

2. The device of claim 1, wherein the channel region includes a high-concentration impurity region being located close to the step side region and having an impurity concentration higher than that of the channel region in a part thereof adjacent to the source region.

3. The device of claim 1, wherein an extremely-low-concentration impurity layer is formed in the step side region.

4. The device of claim 3, wherein the conductivity type of the extremely-low-concentration impurity layer is the same as that of the channel region.

5. The device of claim 3, wherein the conductivity type of the extremely-low-concentration impurity layer is opposite to that of the channel region.

6. A nonvolatile semiconductor memory device comprising:

a substrate having a surface including a first surface region at a first level, a second surface region at a second level lower than the first level, and a step side region linking the first and second surface regions together;

a channel region formed in the first surface region of the substrate;

source and drain regions formed to interpose the channel region therebetween;

a first insulating film formed on the surface of the substrate; and a floating gate formed on the first insulating film, wherein the drain region includes a low-concentration impurity layer which is formed in the second surface region and which has one end extending toward the step side region, and a high-concentration impurity layer which is connected to the low-concentration impurity layer and which is formed in a region distant from the channel region, an impurity concentration of the low-concentration impurity layer being lower than that of the high-concentration impurity layer, and wherein an extremely-low-concentration impurity layer is formed in a part of the channel region adjacent to the step side region, an impurity concentration of the extremely-low-concentration impurity layer being lower than that of the other part of the channel region, and wherein the floating gate covers the step side region and at least a part of the low-concentration impurity layer via the first insulating film.

7. The device of claim 6, wherein the conductivity type of the extremely-low-concentration impurity layer is the same as that of the channel region.

8. The device of claim 6, wherein the conductivity type of the extremely-low-concentration impurity layer is opposite to that of the channel region.

9. A nonvolatile semiconductor memory device comprising:

a substrate having a surface including a first surface region at a first level, a second surface region at a second level lower than the first level, and a step side region linking the first and second surface regions together;

a channel region formed in the first surface region of the substrate;

source and drain regions formed to interpose the channel region therebetween;

a first insulating film formed on the surface of the substrate; and a floating gate formed on the first insulating film, wherein the drain region includes a low-concentration impurity layer which is formed in the second surface region and which has one end extending toward the step side region, and a high-concentration impurity layer which is connected to the low-concentration impurity layer and which is formed in a region distant from the channel region, an impurity concentration of the low-concentration impurity layer being lower than that of the high-concentration impurity layer, and wherein an extremely-low-concentration impurity layer is formed in a part of the channel region adjacent to the step side region and in contact with the first surface region, an impurity concentration of the extremely-low-concentration impurity layer being lower than that of the other part of the channel region, and wherein the floating gate covers the step side region and at least a part of the low-concentration impurity layer via the first insulating film.

10. A semiconductor integrated circuit device comprising:

a plurality of nonvolatile memory cells, each said cell comprising a substrate having a surface including a first surface region at a first level, a second surface region at a second level lower than the first level, and a step side region linking the first and second surface regions together;

a channel region formed in the first surface region of the substrate;

source and drain regions formed to interpose the channel region therebetween;

a first insulating film formed on the surface of the substrate; and a floating gate formed on the first insulating film, wherein the drain region includes a low-concentration impurity layer which is formed in the second surface region and which has one end extending toward the step side region, and a high-concentration impurity layer which is connected to the low-concentration impurity layer and which is formed in a region distant from the channel region,
   an impurity concentration of the low-concentration impurity layer being lower than that of the high-concentration impurity layer, and
   wherein the low-concentration impurity layer covers a corner portion between the second surface region and the step side region, but does not reach the first surface region, and
   wherein the floating gate covers the step side region and at least a part of the low-concentration impurity layer via the first insulating film; and
a driver circuit, formed on the substrate, for driving the nonvolatile memory cells.

11. A semiconductor integrated circuit device comprising:
a plurality of nonvolatile memory cells, each said cell comprising
   a substrate having a surface including a first surface region at a first level, a second surface region at a second level lower than the first level, and a step side region linking the first and second surface regions together;
   a channel region formed in the first surface region of the substrate;
   source and drain regions formed to interpose the channel region therebetween;
   a first insulating film formed on the surface of the substrate; and
   a floating gate formed on the first insulating film,
   wherein the drain region includes
   a low-concentration impurity layer which is formed in the second surface region and which has one end extending toward the step side region, and
   a high-concentration impurity layer which is connected to the low-concentration impurity layer and which is formed in a region distant from the channel region,
   an impurity concentration of the low-concentration impurity layer being lower than that of the high-concentration impurity layer, and
   wherein an extremely-low-concentration impurity layer is formed in a part of the channel region adjacent to the step side region, an impurity concentration of the extremely-low-concentration impurity layer being lower than that of the other part of the channel region, and
   wherein the floating gate covers the step side region and at least a part of the low-concentration impurity layer via the first insulating film; and
a driver circuit, formed on the substrate, for driving the nonvolatile memory cells.

* * * * *